(12) United States Patent
Zhang et al.

(10) Patent No.: US 11,715,889 B2
(45) Date of Patent: *Aug. 1, 2023

(54) SLOW WAVE STRUCTURE FOR MILLIMETER WAVE ANTENNAS

(71) Applicant: Intel Corporation, Santa Clara, CA (US)

(72) Inventors: Zhichao Zhang, Chandler, AZ (US); Jiwei Sun, Chandler, AZ (US); Kemal Aygun, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/402,916

(22) Filed: Aug. 16, 2021

(65) Prior Publication Data

US 2022/0037803 A1 Feb. 3, 2022

Related U.S. Application Data

(63) Continuation of application No. 16/493,520, filed as application No. PCT/US2017/025072 on Mar. 30, 2017, now Pat. No. 11,095,045.

(51) Int. Cl.
*H01Q 21/24* (2006.01)
*H05K 1/02* (2006.01)
*H01P 9/00* (2006.01)

(52) U.S. Cl.
CPC ........... *H01Q 21/24* (2013.01); *H05K 1/0243* (2013.01); *H05K 1/0248* (2013.01); *H01P 9/00* (2013.01); *H05K 2201/10098* (2013.01)

(58) Field of Classification Search
CPC .... H01Q 21/24; H01K 1/0243; H01K 1/0248; H01K 2201/10098
See application file for complete search history.

(56) References Cited

U.S. PATENT DOCUMENTS 11,095,045 B2    8/2021  Zhang et al.
2005/0012564 A1  1/2005  Schoebel
(Continued)

FOREIGN PATENT DOCUMENTS

KR    20080024401 A    3/2008
WO    WO-2018182628 A1 10/2018

OTHER PUBLICATIONS

"U.S. Appl. No. 16/493,520, Non Final Office Action dated Oct. 28, 2020", 16 pgs.
(Continued)

*Primary Examiner* — Hoang V Nguyen
(74) *Attorney, Agent, or Firm* — Schwegman Lundberg & Woessner, P.A.

(57) ABSTRACT

Length matching and phase matching between circuit paths of differing lengths is disclosed. Two signals are specified to arrive at respective path destinations at a predetermined time and with a predetermined phase. An IC provides a first electronic signal over a first conductive path to a first destination and a second electronic signal over a second conductive path to a second destination. A first slow wave structure comprises the first conductive path and a second slow wave structure comprises the second conductive path. The effective relative permittivity of the first slow wave structure is tuned such that the first electronic signal arrives at its destination at a first time and at a first phase, and the effective relative permittivity of the second slow wave structure is tuned such that the second electronic signal arrives at its destination at a second time and at a second phase.

30 Claims, 19 Drawing Sheets

(56) References Cited

U.S. PATENT DOCUMENTS

| | | |
|---|---|---|
| 2011/0241796 A1 | 10/2011 | Mina et al. |
| 2012/0274424 A1 | 11/2012 | Cho |
| 2013/0097577 A1 | 4/2013 | Byrne et al. |
| 2015/0349432 A1 | 12/2015 | Vosburgh |
| 2020/0014122 A1 | 1/2020 | Zhang et al. |

OTHER PUBLICATIONS

"U.S. Appl. No. 16/493,520, Notice of Allowance dated Apr. 9, 2021", 8 pgs.
"U.S. Appl. No. 16/493,520, Response filed Mar. 29, 2021 to Non Final Office Action dated Oct. 28, 2020", 16 pgs.
"International Application Serial No. PCT/US2017/025072, International Preliminary Report on Patentability dated Oct. 10, 2019", 10 pgs.
"International Application Serial No. PCT/US2017/025072, International Search Report dated Dec. 26, 2017", 3 pgs.
"International Application Serial No. PCT/US2017/025072, Written Opinion dated Dec. 26, 2017", 8 pgs.
Kim, Hosaeng, et al., "Size Reduction Method of Coplanar Waveguide (CPW) Electromagnetic Bandgap (EBG) Structures Using Slow Wave Design", IEEE, (2007), 191-194.
Kim, Hosaeng, et al., "Wire-Bond Free Technique for Right-Angle Coplanar Waveguide Bend Structures", IEEE Transactions on Microwave Theory and Techniques, vol. 57, No. 2, (Feb. 2009), 442-448.

US 11,715,889 B2

SLOW WAVE STRUCTURE FOR MILLIMETER WAVE ANTENNAS

PRIORITY

This application is a continuation of U.S. patent application Ser. No. 16/493,520, filed Sep. 12, 2019, which is a U.S. National Stage Application under 35 U.S.C. 371 from International Application No. PCT/US2017/025072, filed Mar. 30, 2017, all of which are hereby incorporated by reference in their entirety.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the drawings that form a part of this document: Copyright Intel Corporation, Santa Clara, Calif. All Rights Reserved.

TECHNICAL FIELD

Embodiments described herein generally relate to physical routing length matching in printed analog and digital package or printed circuit board (PCB) layout design.

BACKGROUND

Physical routing length matching has been challenging in analog radio frequency (RF) (including 5G) and digital server and personal computer (PC) package or PCB layout design. Length matching is needed to achieve equal signal propagation phase delay in situations where a common clock is shared, or there is comparable loss performance, to simplify feed magnitude compensation in antenna arrays. If implementing length matching is done through physical layout design by using traces with various bending radii or serpentine traces, there is a challenge in space constrained designs. This can result in performance degradation when a bending radius is too small or a serpentine trace (or line) intra spacing is too small. Therefore, it is desirable to achieve fixed delay with shorter routing length than is currently seen for such physical routing.

DESCRIPTION OF EMBODIMENTS

Solutions to the physical routing length matching problem may be based on physical layout routing length tuning by using curved structures or serpentine lines (sometimes called traces). But this increases the design challenges, may degrade performance for tightly coupled lines and is subject to space constraint for compact designs.

In some embodiments, slow wave structures are used for shorter routing paths. Slow wave structures are equivalent to tuning the effective relative permittivity of the transmission trace media by increasing both inductance (L) and capacitance (C) in a distributed circuit manner. This will increase the phase delay per unit length for slow wave structures over conventional transmission line, so equivalent phase delay can be achieved with shorter slow wave structures compared to conventional transmission lines.

In some embodiments, the phase delay or length ratio with respect to conventional transmission lines can be tuned by adjusting slow wave structure parameters. By reducing the need for physical length matching, shorter routing length can be employed to achieve the same phase delay or length matching requirement to provide design flexibility in space constrained design practice. The use cases are not limited to millimeter wave, but are broadband use cases, from low frequencies to the millimeter wave spectrum, although the present disclosure will find significant use in the millimeter wave spectrum, given the challenges encountered with the form factor of the PCB board and the package in the case of a mobile device that operates in that spectrum.

Figure 1:
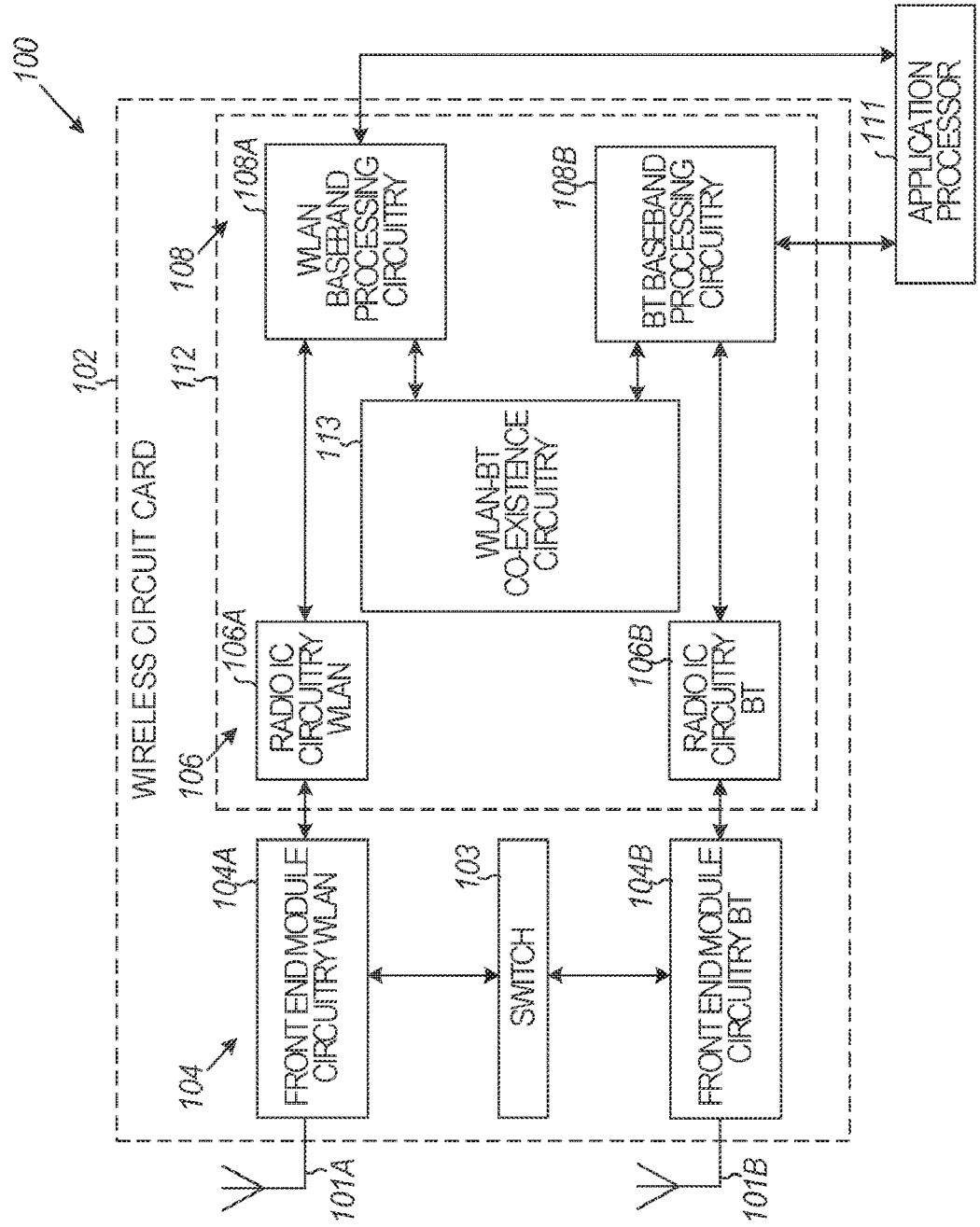
FIG. 1 is a block diagram of a radio architecture in accordance with some embodiments.

FIG. 1 is a block diagram of a radio architecture 100 in accordance with some embodiments. Radio architecture 100 may include radio front-end module (FEM) circuitry 104, radio IC circuitry 106 and baseband processing circuitry 108. Radio architecture 100 as shown includes both Wireless Local Area Network (WLAN) functionality and Bluetooth (BT) functionality although embodiments are not so limited. In this disclosure, "WLAN" and "Wi-Fi" are used interchangeably.

FEM circuitry 104 may include a WLAN or Wi-Fi FEM circuitry 104A and a Bluetooth (BT) FEM circuitry 104B. The WLAN FEM circuitry 104A may include a receive signal path comprising circuitry configured to operate on WLAN RF signals received from one or more antennas 101A, to amplify the received signals and to provide the amplified versions of the received signals to the WLAN radio IC circuitry 106A for further processing. The BT FEM circuitry 104B may include a receive signal path which may include circuitry configured to operate on BT RF signals received from one or more antennas 101B, to amplify the received signals and to provide the amplified versions of the received signals to the BT radio IC circuitry 106B for further processing. FEM circuitry 104A may also include a transmit signal path which may include circuitry configured to amplify WLAN signals provided by the radio IC circuitry 106A for wireless transmission by one or more of the antennas 101A. In addition, FEM circuitry 104B may also include a transmit signal path which may include circuitry configured to amplify BT signals provided by the radio IC circuitry 106B for wireless transmission by the one or more antennas. In the embodiment of FIG. 1, although FEM 104A and FEM 104B are shown as being distinct from one another, embodiments are not so limited, and include within their scope the use of an FEM (not shown) that includes a transmit path and/or a receive path for both WLAN and BT signals, or the use of one or more FEM circuitries where at least some of the FEM circuitries share transmit and/or receive signal paths for both WLAN and BT signals.

Radio IC circuitry 106 as shown may include WLAN radio IC circuitry 106A and BT radio IC circuitry 106B. The WLAN radio IC circuitry 106A may include a receive signal path which may include circuitry to down-convert WLAN RF signals received from the FEM circuitry 104A and provide baseband signals to WLAN baseband processing circuitry 108A. BT radio IC circuitry 106B may in turn include a receive signal path which may include circuitry to down-convert BT RF signals received from the FEM circuitry 104B and provide baseband signals to BT baseband processing circuitry 108B. WLAN radio IC circuitry 106A may also include a transmit signal path which may include circuitry to up-convert WLAN baseband signals provided by the WLAN baseband processing circuitry 108A and provide WLAN RF output signals to the FEM circuitry 104A for subsequent wireless transmission by the one or more antennas 101A. BT radio IC circuitry 106B may also include a transmit signal path which may include circuitry to up-convert BT baseband signals provided by the BT baseband processing circuitry 108B and provide BT RF output signals to the FEM circuitry 104B for subsequent wireless transmission by the one or more antennas 101B. In the embodiment of FIG. 1, although radio IC circuitries 106A and 106B are shown as being distinct from one another, embodiments are not so limited, and include within their scope the use of a radio IC circuitry (not shown) that includes a transmit signal path and/or a receive signal path for both WLAN and BT signals, or the use of one or more radio IC circuitries where at least some of the radio IC circuitries share transmit and/or receive signal paths for both WLAN and BT signals.

Baseband processing circuity 108 may include a WLAN baseband processing circuitry 108A and a BT baseband processing circuitry 108B. The WLAN baseband processing circuitry 108A may include a memory, such as, for example, a set of RAM arrays in a Fast Fourier Transform or Inverse Fast Fourier Transform block (not shown) of the WLAN baseband processing circuitry 108A. Each of the WLAN baseband circuitry 108A and the BT baseband circuitry 108B may further include one or more processors and control logic to process the signals received from the corresponding WLAN or BT receive signal path of the radio IC circuitry 106, and to also generate corresponding WLAN or BT baseband signals for the transmit signal path of the radio IC circuitry 106. Each of the baseband processing circuitries 108A and 108B may further include physical layer (PHY) and medium access control layer (MAC) circuitry, and may further interface with application processor 110 for generation and processing of the baseband signals and for controlling operations of the radio IC circuitry 106.

Referring still to FIG. 1, according to the shown embodiment, WLAN-BT coexistence circuitry 113 may include logic providing an interface between the WLAN baseband circuitry 108A and the BT baseband circuitry 108B to enable use cases requiring WLAN and BT coexistence. In addition, a switch 103 may be provided between the WLAN FEM circuitry 104A and the BT FEM circuitry 104B to allow switching between the WLAN and BT radios according to application needs. In addition, although the antennas 101A, 101B are depicted as being respectively connected to the WLAN FEM circuitry 104A and the BT FEM circuitry 104B, embodiments include within their scope the sharing of one or more antennas as between the WLAN and BT FEMs, or the provision of more than one antenna connected to each of FEM 104A or 104B.

In some embodiments, the front-end module circuitry 104, the radio IC circuitry 106, and baseband processing circuitry 108 may be provided on a single radio card, such as wireless radio card 102. In some other embodiments, the one or more antennas 101, the FEM circuitry 104 and the radio IC circuitry 106 may be provided on a single radio card. In some other embodiments, the radio IC circuitry 106 and the baseband processing circuitry 108 may be provided on a single chip or integrated circuit (IC), such as IC 112.

In some embodiments, the wireless radio card 102 may include a WLAN radio card and may be configured for Wi-Fi communications, although the scope of the embodiments is not limited in this respect. In some of these embodiments, the radio architecture 100 may be configured to receive and transmit orthogonal frequency division multiplexed (OFDM) or orthogonal frequency division multiple access (OFDMA) communication signals over a multicarrier communication channel. The OFDM or OFDMA signals may comprise a plurality of orthogonal subcarriers.

In some of these multicarrier embodiments, radio architecture 100 may be part of a Wi-Fi communication station (STA) such as a wireless access point (AP), a base station, or a mobile device including a Wi-Fi device. In some of these embodiments, radio architecture 100 may comprise a transceiver and be configured to transmit and receive signals in accordance with specific communication standards and/or protocols, such as any of the Institute of Electrical and Electronics Engineers (IEEE) standards including, 802.11n-2009, IEEE 802.11-2012, 802.11n-2009, 802.11ac, and/or 802.11ax standards and/or proposed specifications for WLANs, although the scope of embodiments is not limited in this respect. Radio architecture 100 may also be suitable to transmit and/or receive communications in accordance with other techniques and standards.

In some embodiments, the radio architecture 100 may be configured for high-efficiency (HE) Wi-Fi (HEW) communications in accordance with the IEEE 802.11ax standard. In these embodiments, the radio architecture 100 may be configured to communicate in accordance with an OFDMA technique, although the scope of the embodiments is not limited in this respect.

In some other embodiments, the radio architecture 100 may be configured to transmit and receive signals transmitted using one or more other modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, although the scope of the embodiments is not limited in this respect.

In some embodiments, as further shown in FIG. 1, the BT baseband circuitry 108A may be compliant with a Bluetooth (BT) connectivity standard such as Bluetooth, Bluetooth 4.0 or Bluetooth 5.0, or any other iteration of the Bluetooth Standard. In embodiments that include BT functionality as shown for example in FIG. 1, the radio architecture 100 may be configured to establish a BT synchronous connection oriented (SCO) link and or a BT low energy (BT LE) link. In some of the embodiments that include functionality, the radio architecture 100 may be configured to establish an extended SCO (eSCO) link for BT communications, although the scope of the embodiments is not limited in this respect. In some of these embodiments that include a BT functionality, the radio architecture may be configured to engage in a BT Asynchronous Connection-Less (ACL) communications, although the scope of the embodiments is not limited in this respect. In some embodiments, as shown in FIG. 1, the functions of a BT radio card and WLAN radio card may be combined on a single wireless radio card, such as single wireless radio card 102, although embodiments are not so limited, and include within their scope discrete WLAN and BT radio cards In some embodiments, the radio-architecture 100 may include other radio cards, such as a cellular radio card configured for cellular (e.g., 3GPP such as LTE, LTE-Advanced or 5G communications).

In some IEEE 802.11 embodiments, the radio architecture 100 may be configured for communication over various channel bandwidths including bandwidths having center frequencies of about 900 MHz, 2.4 GHz, 5 GHz, and bandwidths of about 1 MHz, 2 MHz, 2.5 MHz, 4 MHz, 5 MHz, 8 MHz, 10 MHz, 16 MHz, 20 MHz, 40 MHz, 80 MHz (with contiguous bandwidths) or 80+80 MHz (160 MHz) (with non-contiguous bandwidths). In some embodiments, a 320 MHz channel bandwidth may be used. The scope of the embodiments is not limited with respect to the above center frequencies however.

Figure 2:
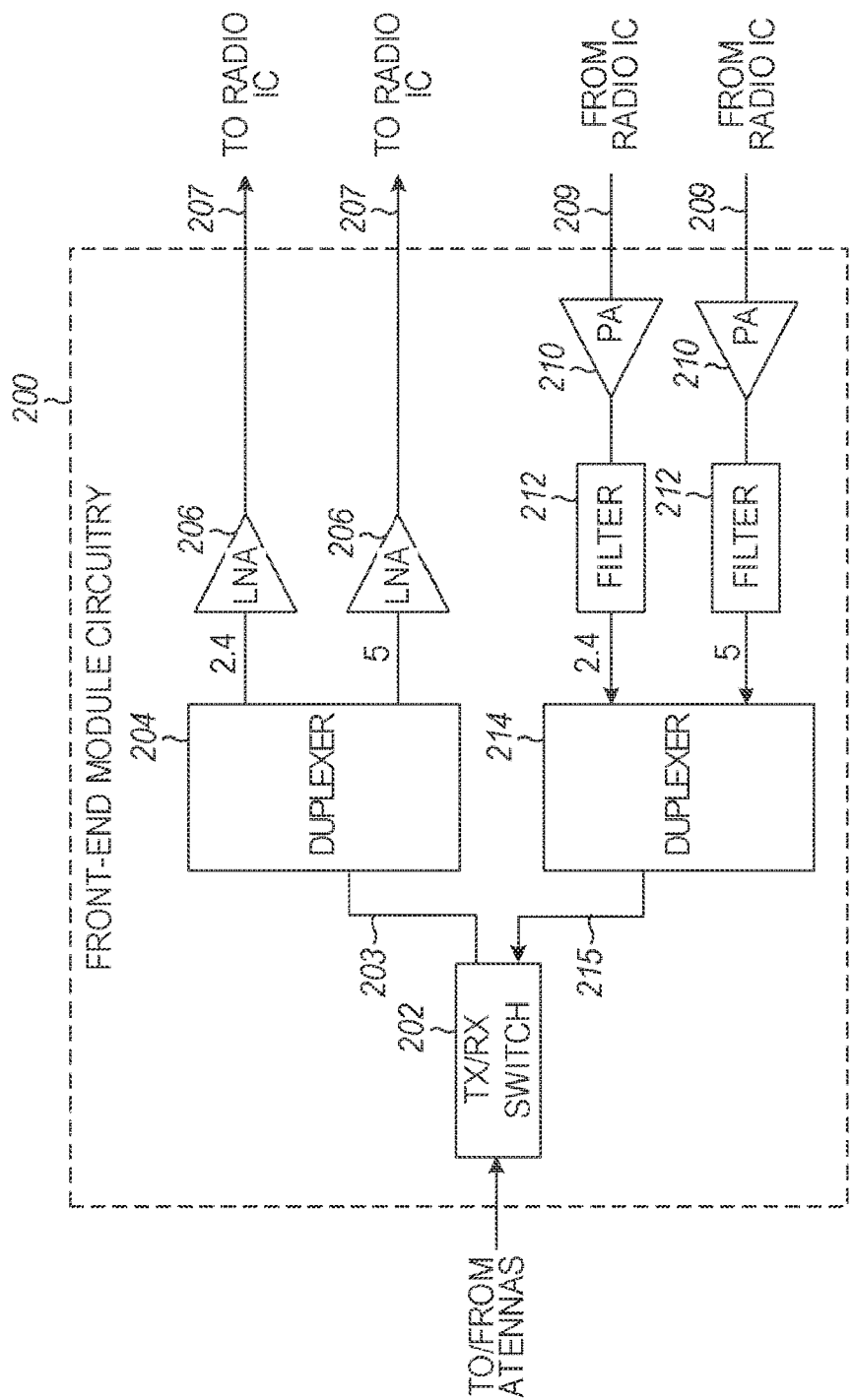
FIG. 2 illustrates a front-end module circuitry for use in the radio architecture of FIG. 1 in accordance with some embodiments.

FIG. 2 illustrates FEM circuitry 200 in accordance with some embodiments. The FEM circuitry 200 is one example of circuitry that may be suitable for use as the WLAN and/or BT FEM circuitry 104A/104B (FIG. 1), although other circuitry configurations may also be suitable.

In some embodiments, the FEM circuitry 200 may include a TX/RX switch 202 to switch between transmit mode and receive mode operation. The FEM circuitry 200 may include a receive signal path and a transmit signal path. The receive signal path of the FEM circuitry 200 may include a low-noise amplifier (LNA) 206 to amplify received RF signals 203 and provide the amplified received RF signals 207 as an output (e.g., to the radio IC circuitry 106 (FIG. 1)). The transmit signal path of the circuitry 200 may include a power amplifier (PA) to amplify input RF signals 209 (e.g., provided by the radio IC circuitry 106), and one or more filters 212, such as band-pass filters (BPFs), low-pass filters (LPFs) or other types of filters, to generate RF signals 215 for subsequent transmission (e.g., by one or more of each of the antennas 101A, 101B (FIG. 1)).

In some dual-mode embodiments for Wi-Fi communication, the FEM circuitry 200 may be configured to operate in either the 2.4 GHz frequency spectrum or the 5 GHz frequency spectrum. In these embodiments, the receive signal path of the FEM circuitry 200 may include a receive signal path duplexer 204 to separate the signals from each spectrum as well as provide a separate LNA 206 for each spectrum as shown. In these embodiments, the transmit signal path of the FEM circuitry 200 may also include a power amplifier 210 and a filter 212, such as a BPF, a LPF or another type of filter for each frequency spectrum and a transmit signal path duplexer 214 to provide the signals of one of the different spectrums onto a single transmit path for subsequent transmission by the one or more of the antennas 101 (FIG. 1). In some embodiments, BT communications may utilize the 2.4 GHZ signal paths and may utilize the same FEM circuitry 200 as the one used for WLAN communications.

Figure 3:
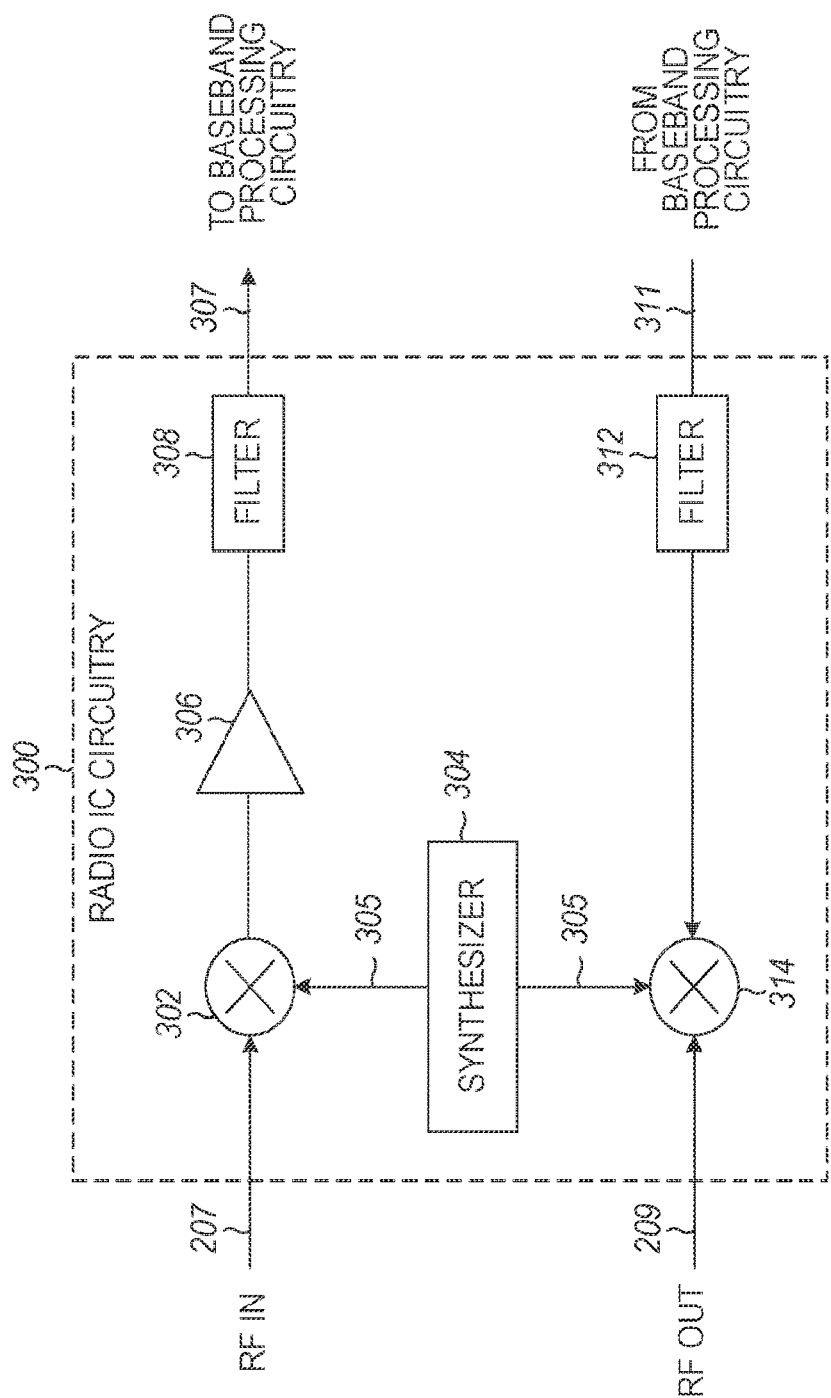
FIG. 3 illustrates a radio IC circuitry for use in the radio architecture of FIG. 1 in accordance with some embodiments.

FIG. 3 illustrates radio IC circuitry 300 in accordance with some embodiments. The radio IC circuitry 300 is one example of circuitry that may be suitable for use as the WLAN or BT radio IC circuitry 106A/106B (FIG. 1), although other circuitry configurations may also be suitable.

In some embodiments, the radio IC circuitry 300 may include a receive signal path and a transmit signal path. The receive signal path of the radio IC circuitry 300 may include at least mixer circuitry 302, such as, for example, down-conversion mixer circuitry, amplifier circuitry 306 and filter circuitry 308. The transmit signal path of the radio IC circuitry 300 may include at least filter circuitry 312 and mixer circuitry 314, such as, for example, up-conversion mixer circuitry. Radio IC circuitry 300 may also include synthesizer circuitry 304 for synthesizing a frequency 305 for use by the mixer circuitry 302 and the mixer circuitry 314. The mixer circuitry 302 and/or 314 may each, according to some embodiments, be configured to provide direct conversion functionality. The latter type of circuitry presents a much simpler architecture as compared with standard super-heterodyne mixer circuitries, and any flicker noise brought about by the same may be alleviated for example through the use of OFDM modulation. FIG. 3 illustrates only a simplified version of a radio IC circuitry, and may include, although not shown, embodiments where each of the depicted circuitries may include more than one component. For instance, mixer circuitry 320 and/or 314 may each include one or more mixers, and filter circuitries 308 and/or 312 may each include one or more filters, such as one or more BPFs and/or LPFs according to application needs. For example, when mixer circuitries are of the direct-conversion type, they may each include two or more mixers.

In some embodiments, mixer circuitry 302 may be configured to down-convert RF signals 207 received from the FEM circuitry 104 (FIG. 1) based on the synthesized frequency 305 provided by synthesizer circuitry 304. The amplifier circuitry 306 may be configured to amplify the down-converted signals and the filter circuitry 308 may include a LPF configured to remove unwanted signals from the down-converted signals to generate output baseband signals 307. Output baseband signals 307 may be provided to the baseband processing circuitry 108 (FIG. 1) for further processing. In some embodiments, the output baseband signals 307 may be zero-frequency baseband signals, although this is not a requirement. In some embodiments, mixer circuitry 302 may comprise passive mixers, although the scope of the embodiments is not limited in this respect.

In some embodiments, the mixer circuitry 314 may be configured to up-convert input baseband signals 311 based on the synthesized frequency 305 provided by the synthesizer circuitry 304 to generate RF output signals 209 for the FEM circuitry 104. The baseband signals 311 may be provided by the baseband processing circuitry 108 and may be filtered by filter circuitry 312. The filter circuitry 312 may include a LPF or a BPF, although the scope of the embodiments is not limited in this respect.

In some embodiments, the mixer circuitry 302 and the mixer circuitry 314 may each include two or more mixers and may be arranged for quadrature down-conversion and/or up-conversion respectively with the help of synthesizer 304. In some embodiments, the mixer circuitry 302 and the mixer circuitry 314 may each include two or more mixers each configured for image rejection (e.g., Hartley image rejection). In some embodiments, the mixer circuitry 302 and the mixer circuitry 314 may be arranged for direct down-conversion and/or direct up-conversion, respectively. In some embodiments, the mixer circuitry 302 and the mixer circuitry 314 may be configured for super-heterodyne operation, although this is not a requirement.

Mixer circuitry 302 may comprise, according to one embodiment: quadrature passive mixers (e.g., for the in-phase (I) and quadrature phase (Q) paths). In such an embodiment, RF input signal 207 from FIG. 3 may be down-converted to provide I and Q baseband output signals to be sent to the baseband processor Quadrature passive mixers may be driven by zero and ninety degree time-varying LO switching signals provided by a quadrature circuitry which may be configured to receive a LO frequency (fLO) from a local oscillator or a synthesizer, such as LO frequency 305 of synthesizer 304 (FIG. 3). In some embodiments, the LO frequency may be the carrier frequency, while in other embodiments, the LO frequency may be a fraction of the carrier frequency (e.g., one-half the carrier frequency, one-third the carrier frequency). In some embodiments, the zero and ninety degree time-varying switching signals may be generated by the synthesizer, although the scope of the embodiments is not limited in this respect.

In some embodiments, the LO signals may differ in duty cycle (the percentage of one period in which the LO signal is high) and/or offset (the difference between start points of the period). In some embodiments, the LO signals may have a 25% duty cycle and a 50% offset. In some embodiments, each branch of the mixer circuitry (e.g., the in-phase (I) and quadrature phase (Q) path) may operate at a 25% duty cycle, which may result in a significant reduction is power consumption.

The RF input signal 207 (FIG. 2) may comprise a balanced signal, although the scope of the embodiments is not limited in this respect. The I and Q baseband output signals may be provided to low-nose amplifier, such as amplifier circuitry 306 (FIG. 3) or to filter circuitry 308 (FIG. 3).

In some embodiments, the output baseband signals 307 and the input baseband signals 311 may be analog baseband signals, although the scope of the embodiments is not limited in this respect. In some alternate embodiments, the output baseband signals 307 and the input baseband signals 311 may be digital baseband signals. In these alternate embodiments, the radio IC circuitry may include analog-to-digital converter (ADC) and digital-to-analog converter (DAC) circuitry.

In some dual-mode embodiments, a separate radio IC circuitry may be provided for processing signals for each spectrum, or for other spectrums not mentioned here, although the scope of the embodiments is not limited in this respect.

In some embodiments, the synthesizer circuitry 304 may be a fractional-N synthesizer or a fractional N/N+1 synthesizer, although the scope of the embodiments is not limited in this respect as other types of frequency synthesizers may be suitable. For example, synthesizer circuitry 304 may be a delta-sigma synthesizer, a frequency multiplier, or a synthesizer comprising a phase-locked loop with a frequency divider. According to some embodiments, the synthesizer circuitry 304 may include digital synthesizer circuitry. An advantage of using a digital synthesizer circuitry is that, although it may still include some analog components, its footprint may be scaled down much more than the footprint of an analog synthesizer circuitry. In some embodiments, frequency input into synthesizer circuity 304 may be provided by a voltage controlled oscillator (VCO), although that is not a requirement. A divider control input may further be provided by either the baseband processing circuitry 108 (FIG. 1) or the application processor 110 (FIG. 1) depending on the desired output frequency 305. In some embodiments, a divider control input (e.g., N) may be determined from a look-up table (e.g., within a Wi-Fi card) based on a channel number and a channel center frequency as determined or indicated by the application processor 110.

In some embodiments, synthesizer circuitry 304 may be configured to generate a carrier frequency as the output frequency 305, while in other embodiments, the output frequency 305 may be a fraction of the carrier frequency (e.g., one-half the carrier frequency, one-third the carrier frequency). In some embodiments, the output frequency 305 may be a LO frequency (fLO).

Figure 4:
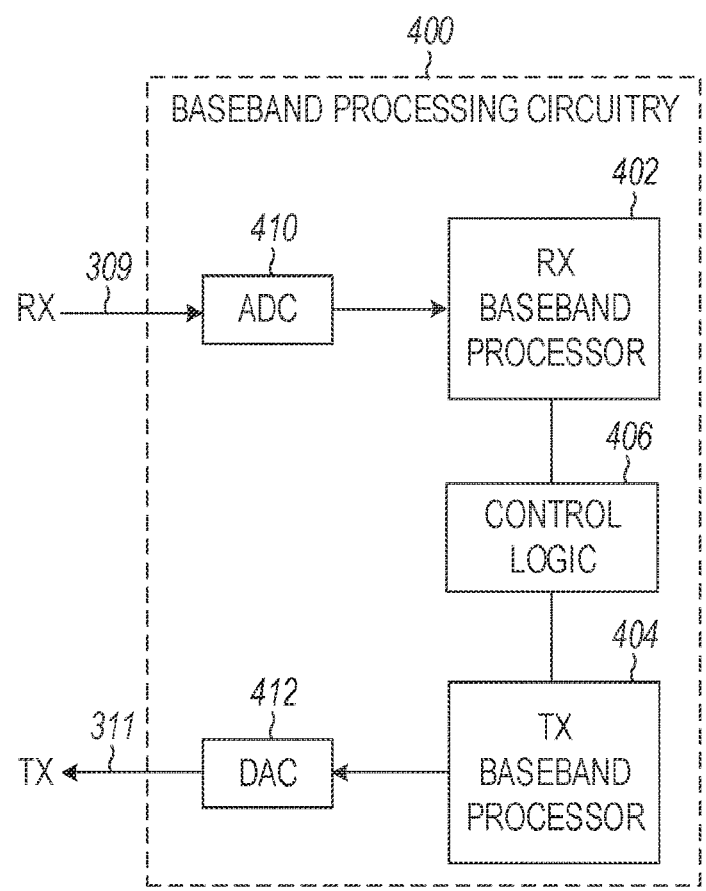
FIG. 4 illustrates a baseband processing circuitry for use in the radio architecture of FIG. 1 in accordance with some embodiments.

FIG. 4 illustrates a functional block diagram of baseband processing circuitry 400 in accordance with some embodiments. The baseband processing circuitry 400 is one example of circuitry that may be suitable for use as the baseband processing circuitry 108 (FIG. 1), although other circuitry configurations may also be suitable. The baseband processing circuitry 400 may include a receive baseband processor (RX BBP) 402 for processing receive baseband signals 309 provided by the radio IC circuitry 106 (FIG. 1) and a transmit baseband processor (TX BBP) 404 for generating transmit baseband signals 311 for the radio IC circuitry 106. The baseband processing circuitry 400 may also include control logic 406 for coordinating the operations of the baseband processing circuitry 400.

In some embodiments (e.g., when analog baseband signals are exchanged between the baseband processing circuitry 400 and the radio IC circuitry 106), the baseband processing circuitry 400 may include ADC 410 to convert analog baseband signals received from the radio IC circuitry 106 to digital baseband signals for processing by the RX BBP 402. In these embodiments, the baseband processing circuitry 400 may also include DAC 412 to convert digital baseband signals from the TX BBP 404 to analog baseband signals.

In some embodiments that communicate OFDM signals or OFDMA signals, such as through baseband processor 108A, the transmit baseband processor 404 may be configured to generate OFDM or OFDMA signals as appropriate for transmission by performing an inverse fast Fourier transform (IFFT). The receive baseband processor 402 may be configured to process received OFDM signals or OFDMA signals by performing an FFT. In some embodiments, the receive baseband processor 402 may be configured to detect the presence of an OFDM signal or OFDMA signal by performing an autocorrelation, to detect a preamble, such as a short preamble, and by performing a cross-correlation, to detect a long preamble. The preambles may be part of a predetermined frame structure for Wi-Fi communication.

Referring back to FIG. 1, in some embodiments, the antennas 101A, 101B (FIG. 1) may each comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas may be effectively separated to take advantage of spatial diversity and the different channel characteristics that may result. Antennas 101A, 101B may each include a set of phased-array antennas, although embodiments are not so limited.

Although the radio-architecture 100 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements may refer to one or more processes operating on one or more processing elements.

Figure 5:
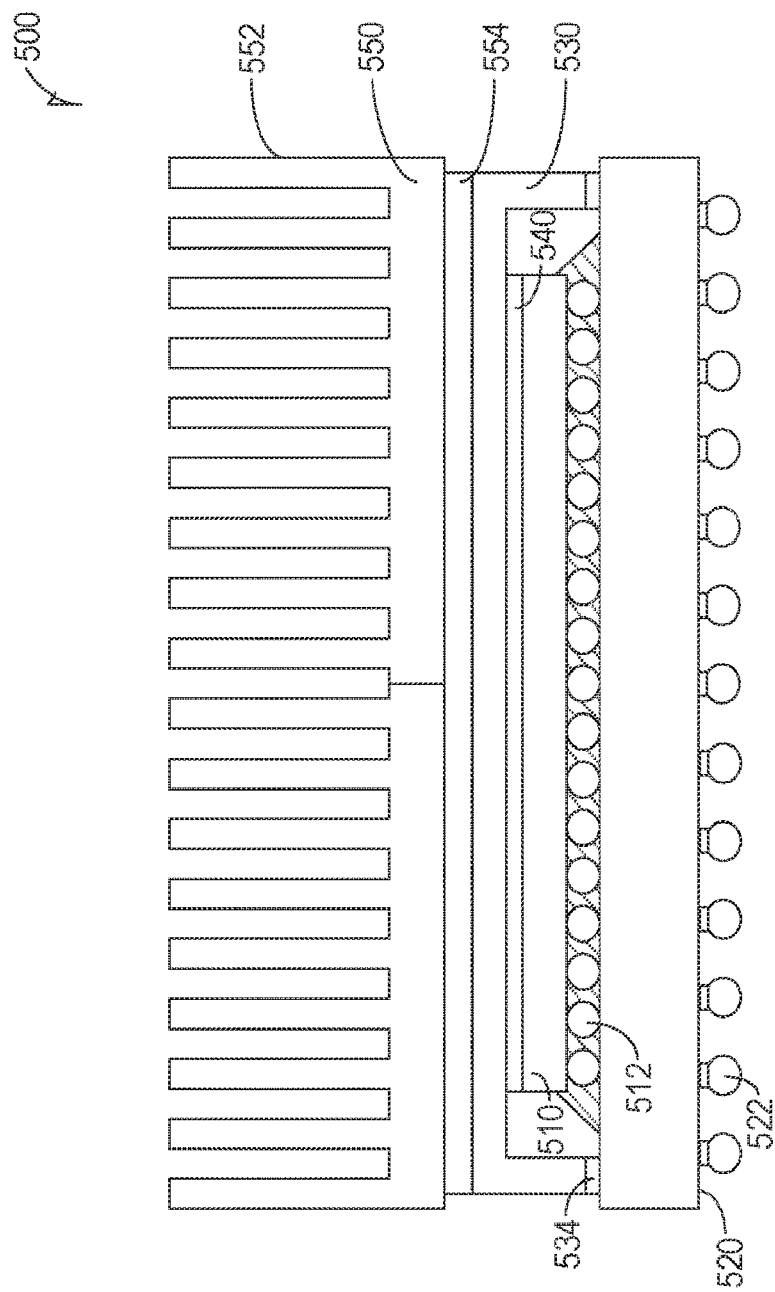
FIG. 5 is a cross section view of an IC package in accordance with some embodiments.

Radio IC circuitry 106 of FIG. 1 may be encapsulated within IC packages, according to some embodiments. FIG. 5 shows a cross-sectional representation of such an IC package 500. In embodiments where the IC die is a processor die, the IC package can be termed a processor assembly. IC package 500 includes an IC die 510 mounted in "flip-chip" orientation with its active side facing downward to couple with an upper surface of a substrate 520, through interconnections 512 such as solder balls or bumps. The substrate 520 also shows a second number of first level interconnections 522 on its opposite surface for mating with additional packaging structures such as boards (not shown).

Die 510 generates its heat from internal structure, including wiring traces, located near its active side; however, a significant portion of the heat is dissipated through its back side 514. Heat that is concentrated within the die is dissipated to a large surface that is in contact with the die in the form of an integrated heat spreader 530. A thermal interface material 540 is often provided between the die 510 and integrated heat spreader 530. In one embodiment, to further dissipate heat from the integrated heat spreader 530, a heat sink 550 optionally having fins 552 is coupled to the integrated heat spreader 530.

In one example, some solder materials used for soldering discussed above may melt at a temperature between approximately 100° C. and 250° C. In one example, the solder materials may melt at a temperature between approximately 120° C. and 200° C. Using a solder with a melting temperature that is lower than melting points of current solders allows electronic devices such as IC package 500 from FIG. 5 to be manufactured at a lower temperature. Using lower temperatures reduces thermal stresses on components of the IC package 500, and leads to higher manufacturing yields of existing component geometries and/or allows more aggressive thinning of components. In addition to use for the interconnection levels 512 and 522, solder materials are also used in other microelectronic applications, as between stacked silicon dies in a multiple die package. There are a number of technical challenges involved in applying solder to interconnections such as interconnections 512 and 522 shown in FIG. 5. As many as several thousand interconnection pads may require application of solder in a typical IC device. While solders provide a number of advantages such as reduced thermal stresses during a soldering operation, there are unique solder processing challenges, including but not limited to solder stability before and during application, and chemically reacting the solder to form an interconnection.

Figure 6:
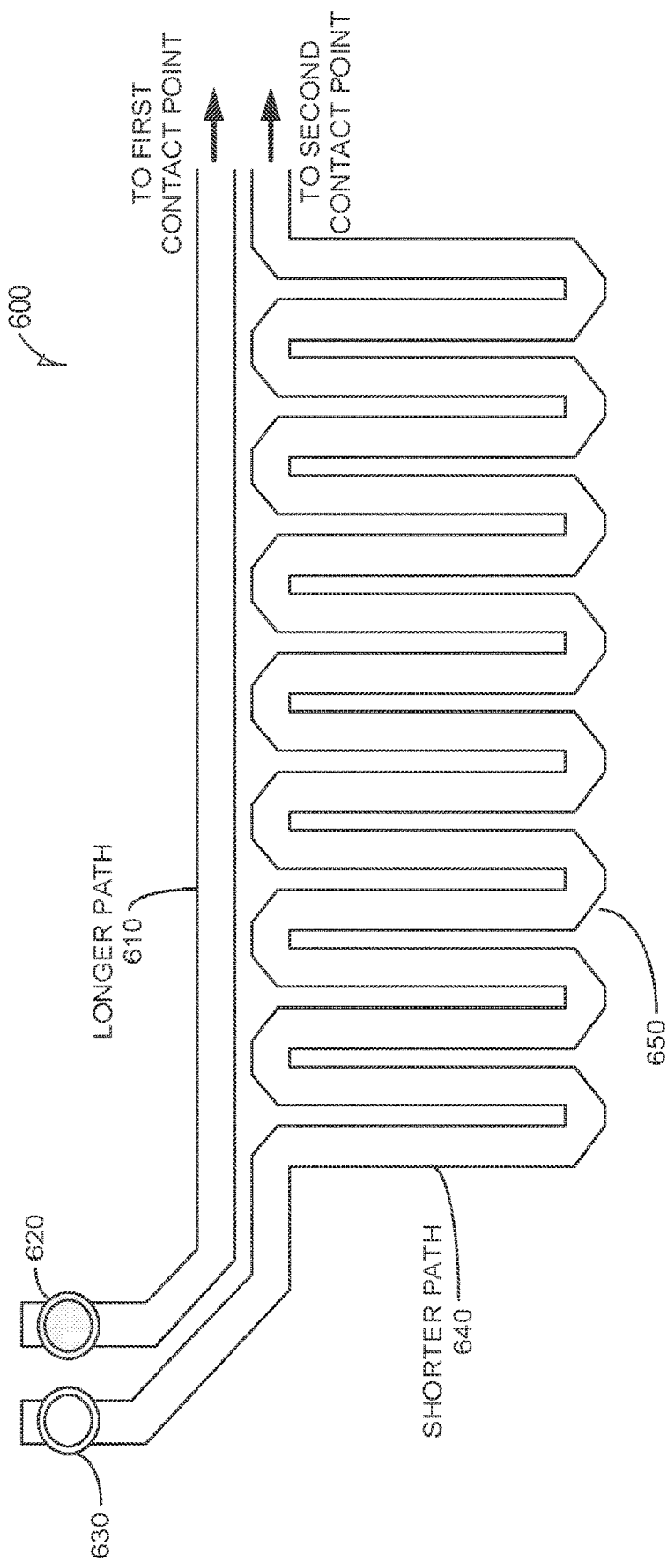
FIG. 6 illustrates how serpentine traces are used for physical routing length and phase delay matching.

FIG. 6 illustrates how serpentine traces are used for physical routing length and phase delay matching. Two metal traces are illustrated at 600. The example for FIG. 6 is a general case, and the assumption is that trace 610 has a longer path to conduct a signal to its contact point, and trace 640 has a shorter path to connect its signal to its contact point. For example, trace 610 connects point 620 to a first contact point (not shown). Trace 640 connects contact point 630 to a second contact point (also not shown). The assumption is that the signal for trace 610 has the longer signal path to its destination and the signal for trace 640 has the shorter signal path to its destination. Further, each signal must reach its contact point at essentially the same time and, in some examples, at the same phase. This is accomplished by using a serpentine trace seen generally at 650 (or in some instances merely a curved trace) to meet the requirement of same time arrival of the signals at the same phase. This length matching and phase matching is a tedious process.

Figure 7:
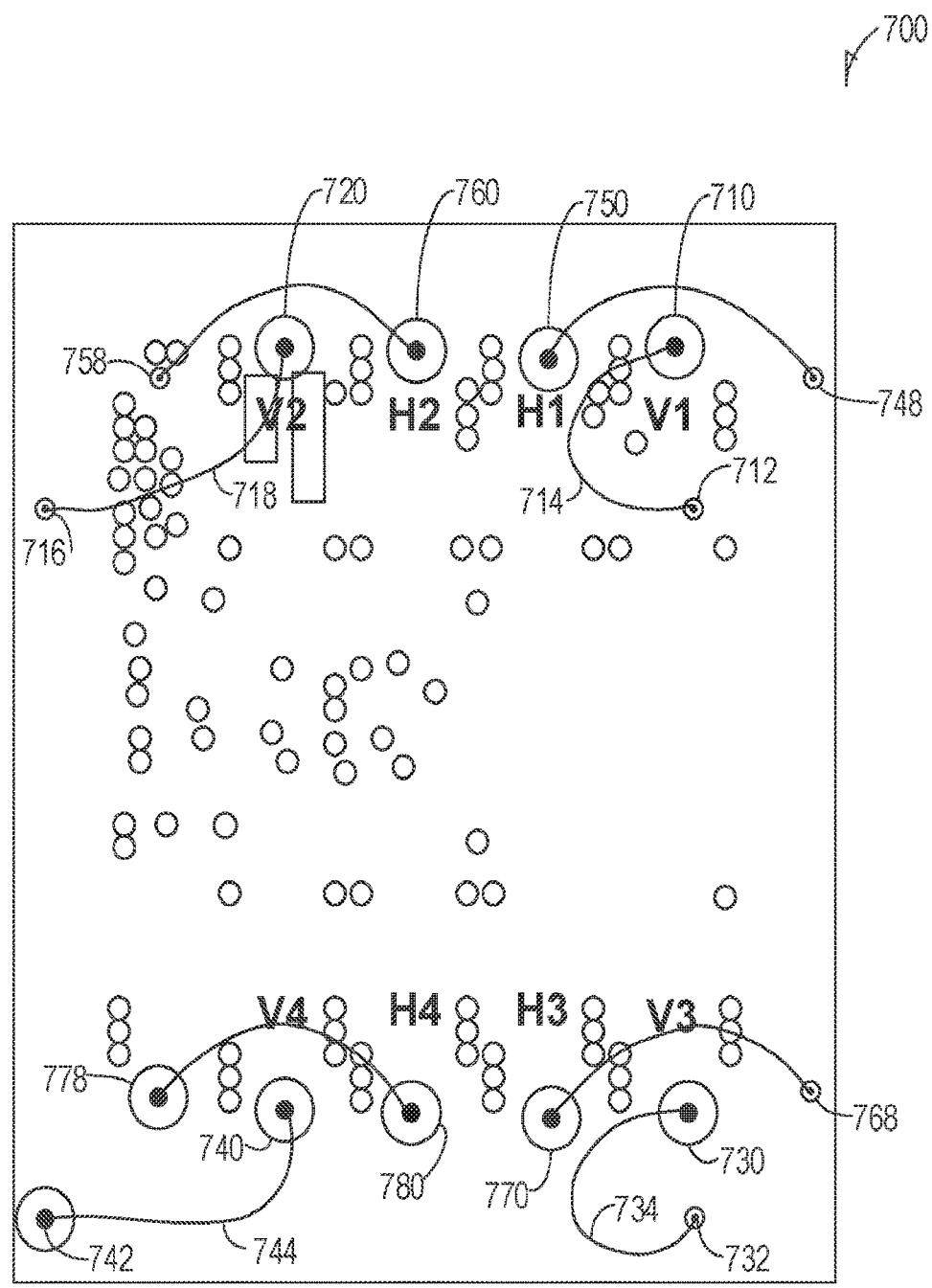
FIG. 7 illustrates bending traces to achieve length matching in a radio frequency (RF) antenna array.

A more specific case 700 is seen in FIG. 7. FIG. 7 illustrates bending traces to achieve length matching in a radio frequency (RF) antenna array. For example, FIG. 7 illustrates at 700 antenna feeds for an antenna array of, in some embodiments, four antenna elements of a dual polarization antenna array, where the V nodes represent antenna feeds for vertically polarized signals and the H nodes represent antenna feeds for horizontally polarized signals. In order to provide effective antenna operation, all four RF signals that are to be transmitted at a given polarization should arrive at the feed points for that polarization at the same time. For example, for vertically polarized signals V1, V2, V3 and V4, the signals on traces 714, 718, 734 and 744 should arrive from respective vias 712, 716, 732, and 742 at respective vertical polarization feed points 710, 720, 730, and 740 at essentially the same time and at the same phase. The same situation holds for horizontally polarized signals H1, H2, H3, and H4. Because of the different path lengths for each signal, various curved and serpentine traces may be used, and the very tedious length matching and phase matching process to provide that signals reach their respective feed points at substantially the same times and at substantially the same phase, is clearly indicated. For example, the distance between via 732 and feed 730 is noticeably and significantly less than the distance between via 742 and feed 740. Therefore because the signal has less distance to travel from via 732 to feed 730, than the signal that travels from via 742 to feed 740, the signal on trace 734 would arrive much sooner than the signal on trace 744 if trace 734 were straight. Therefore, trace 734 is given a much bigger bend, or serpentine path, than trace 744 in order to match the length and phase to the differing distances the signal travels, so that both signals arrive at their respective feeds at substantially the same time and substantially at the same phase.

The problems evident in the above FIG. 7 can be reduced by using a slow wave structure. The material of the slow wave structure can be any general material used for signal transmission for digital or analog applications. However, the design of the slow wave structure itself is equivalent to tuning the properties of the material, but neither the material nor its properties themselves change. Instead, the properties are tuned, as discussed in additional detail below.

Figure 8:
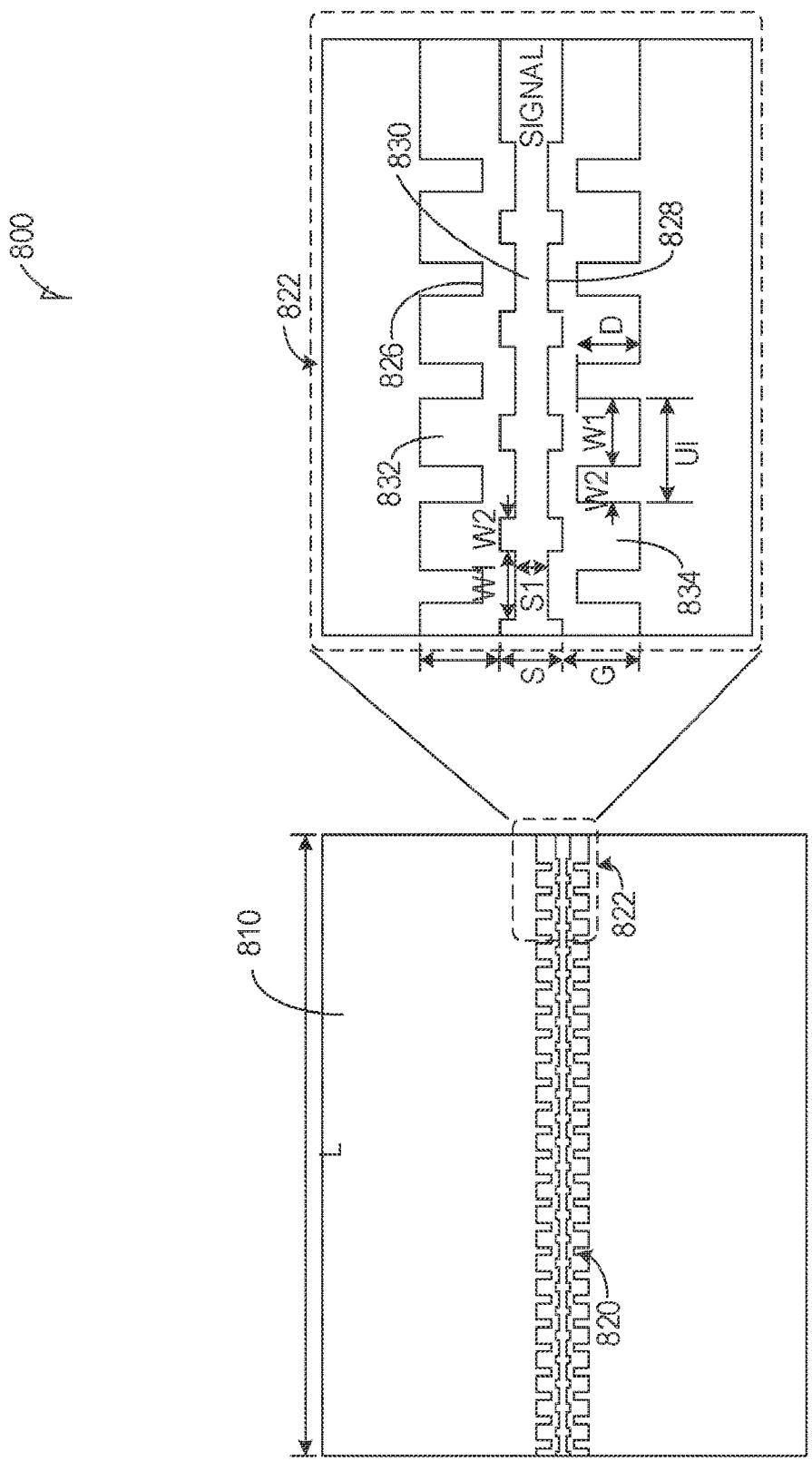
FIG. 8 illustrates a slow wave structure that may be used in accordance with some embodiments.

FIG. 8 illustrates a slow wave structure 800 that may be used in accordance with some embodiments. PCB board 810 may function as a ground plane. Slow wave structure 820 may be etched, printed or otherwise affixed to board 810. A section 822 of slow wave structure 820 is seen in magnified view 822. The slow wave structure transmits the signal. Generally, the slow wave structure can increase the effective relative permittivity of the transmission media by increasing the effective inductance and capacitance at the same time by using the periodic width tuning structures illustrated at 826, 828. The tuning of the effective relative permittivity is implemented by changing the unit length of periodic width tuning structures and the trace width of narrow section in a unit cell. The slow wave structure 822 increases the capacitance of the transmission medium 830 by adding finger-shaped metal patterns, and increases the inductance of the transmission medium 830 by reducing the signal width. As shown in FIG. 8, the regular 50Ω Grounded Co-Planar Waveguide (GCPW) width S can be reduced to S1 to increase the inductance. The finger shaped metal pattern extends from the ground plane GND. The ground plane GND, and the SIGNAL line transmission portion of the slow wave structure, are conductive areas. Areas 832, 834 are dielectric areas. The metal layer 830 on the dielectric layer be etched on, or otherwise affixed to or printed on, the dielectric layer to form the slow wave structure.

Generally, as inductance of the slow wave transmission medium increases and capacitance of the slow wave transmission medium increases, the effective relative permittivity $\varepsilon_r$ increases. Based on the above dimensions, a signal propagating on a slow wave structure is going to have a different speed than a signal on a regular trace, and that speed will slower in order to enable the signal to arrive at its contact point on a PCB at a designated time, which would normally be at the same time as another signal arrives at its own contact point, where both signals are needed to arrive at essentially the same time. Phase can similarly be matched as illustrated below with respect to FIG. 12.

The design parameters of a slow wave structure, seen in the dimensions in FIG. 8, are:
S1
UI=W1+W2; and
D
Where, with reference to FIG. 8:
S: Regular 50Ω Grounded Co-Planar Waveguide (GCPW) width
G: Regular 50Ω GCPW gapwidth
UI: Unit length UI=$W_1$+$W_2$
S1: Trace width of narrow section in a unit cell
D: Finger-shaped stub length of coplanar ground (D)
UI and S1 are used to tune the effective relative permittivity. D is used to design 50Ω slow wave GCPWs.

The slow wave structure illustrated in FIG. 8 comprises a plurality of unit cells, each unit cell having a narrow section S1, a broad section S, and a cell length UI=W1+W2. The use of the above parameters in designing a slow wave structure using simulation is described below with respect to FIG. 12A.

Figure 9:
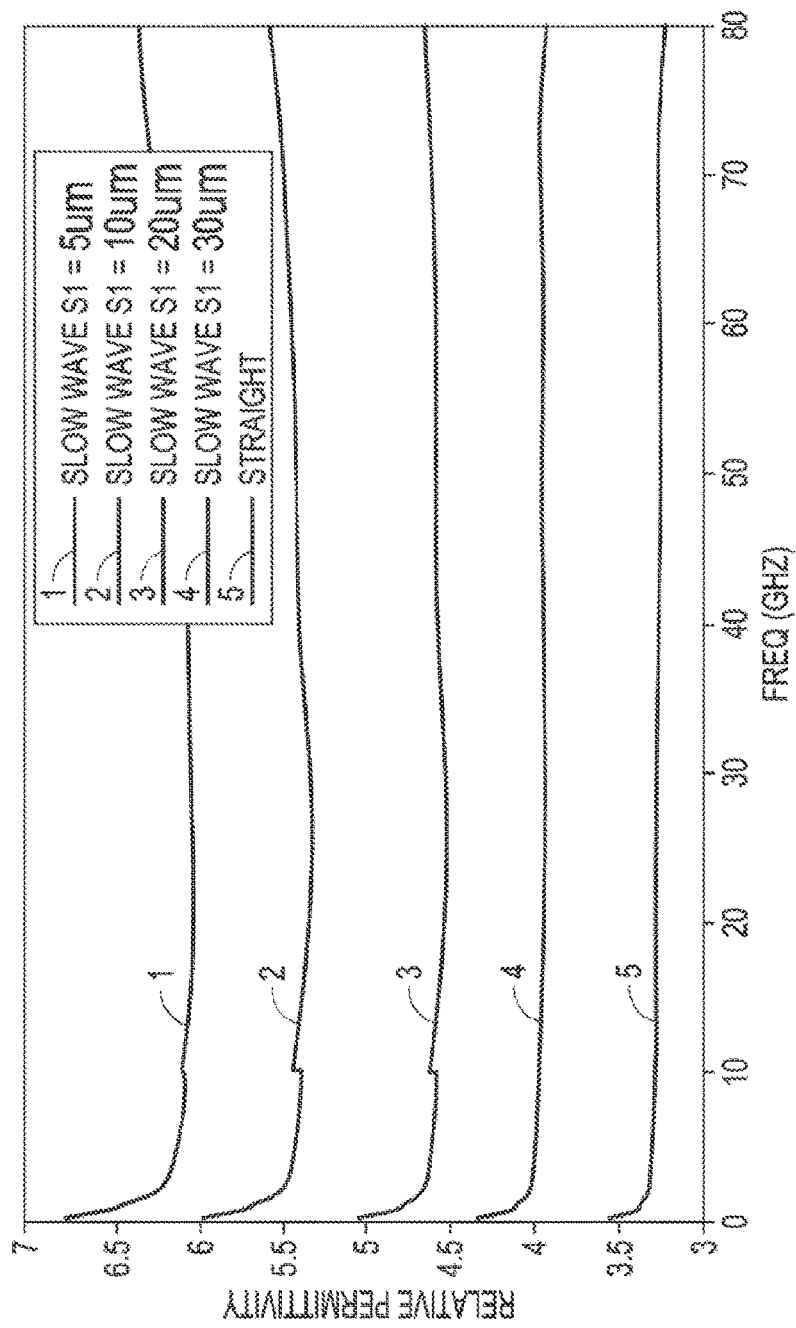
FIG. 9 illustrates the variation of relative permittivity with different values of S1 in FIG. 8 in accordance with some embodiments.

FIG. 9 illustrates parameters of slow wave structures as described herein, in graphical terms. FIG. 9 illustrates the variation of relative permittivity with different values of S1 in FIG. 8 in accordance with some embodiments. For additional information relative to the general subject of slow wave structures, the reader is referred to the papers *Size Reduction Method of Coplanar Waveguide (CPW) Electromagnetic Bandgap (EBG) Structures Using Slow Wave Design*, Hosaeng Kim and Rhonda Franklin Drayton, Department of Electrical and Computer Engineering, University of Minnesota, Minneapolis, Minn. 55455, USA, IEEE publication 0-7803-9764-9/07 © 2007 IEEE; and *Wire-Bond Free Technique for Right-Angle Coplanar Waveguide Bend Structures*, Hosaeng Kim and Rhonda Franklin Drayton, IEEE Transactions on Microwave Theory and Techniques, Vol. 57, No. 2, February 2009.

FIG. 9 illustrates that for a given UI, $\varepsilon_r$ increases with decreasing S1. The permittivity of a slow wave structure can be tuned to a different relative permittivity for different dimensions of S1, where the dimension S1 is shown in FIG. 8. The graph illustrates that the permittivity ranges from about 4 for SI=30 um to about 6.3 for SI=5 um, and the permittivity varies slightly for various frequencies from 10 GHz to 80 GHz. These tuned permittivities compare to a permittivity of about 3.4 or 3.3 for straight transmission line or trace 5. Therefore it can be seen that length matching due to difference in signal speed, which is a function of permittivity, and phase matching can be achieved. The slight variation of permittivity over a wide range of frequencies illustrates the broadband nature of the use of slow wave structures for the purpose described.

Figure 10:
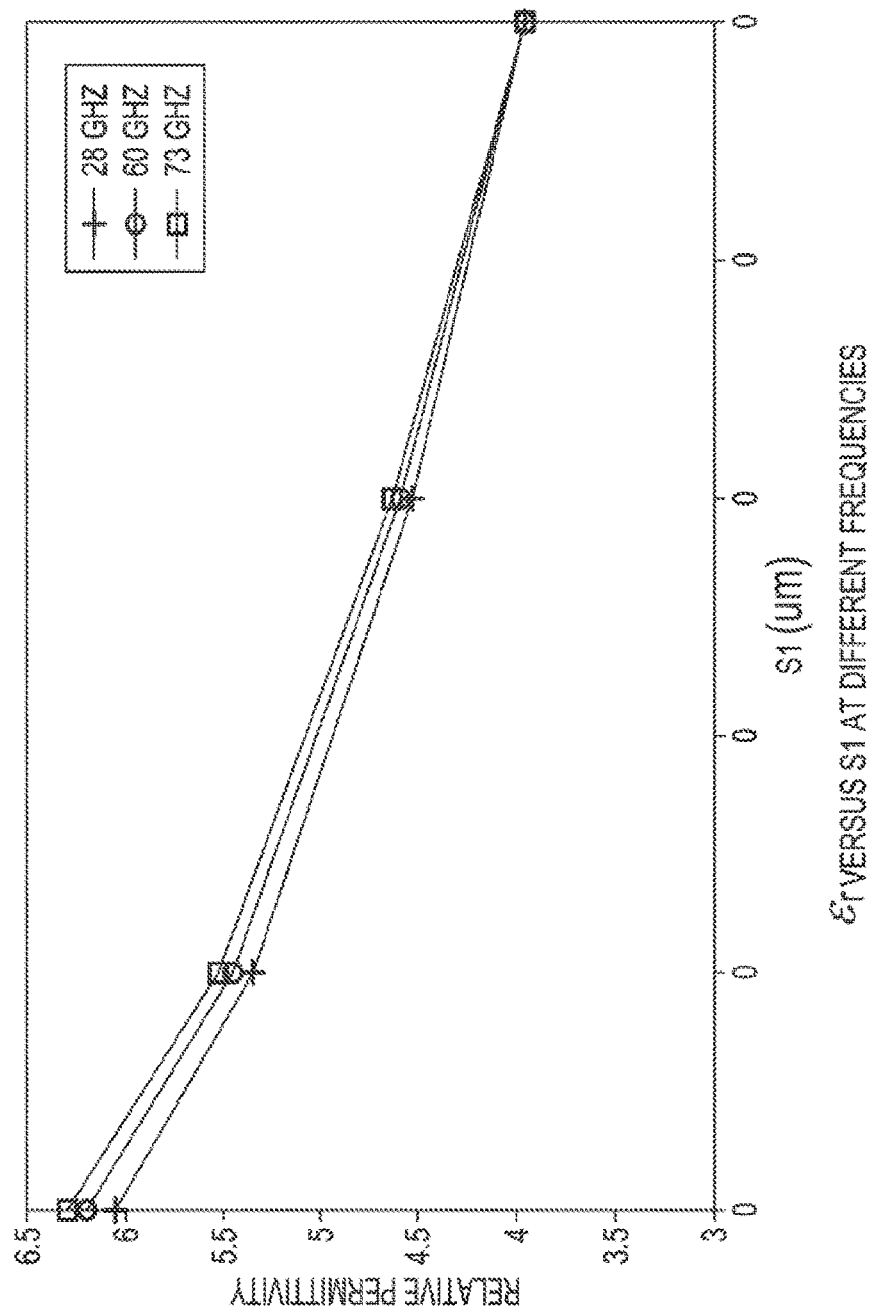
FIG. 10 illustrates variation of relative permittivity at various values of S1 at three different frequencies, in accordance with some embodiments.

FIG. 10 illustrates variation of relative permittivity at various values of S1 at three different frequencies, in accordance with some embodiments. Curve 1000, at 28 GHz, curve 1010 at 60 GHz, and curve 1020 at 73 GHz illustrate a very similar drop off for various values of SI. In other words, the values of relative permittivity at a wide range of frequencies do not vary substantially, again illustrating the broadband nature of the use of slow wave structures as described herein. The values used for FIGS. 9 and 10 are seen in Table 1, below.

TABLE 1

|  | UI (μm) | $W_1$ (μm) | $W_2$ (μm) | S (μm) | G (μm) | L (μm) | S1 (μm) | D (μm) | $\epsilon_T$ at 28 GHz | $\epsilon_T$ at 60 GHz | $\epsilon_T$ at 73 GHz |
|---|---|---|---|---|---|---|---|---|---|---|---|
| SW1 | 120 | 80 | 40 | 50 | 63 | 2.5 | 5 | 77 | 6.05 | 6.19 | 6.30 |
| SW 2 | 120 | 80 | 40 | 50 | 63 | 2.5 | 10 | 72 | 5.35 | 5.46 | 5.52 |
| SW 3 | 120 | 80 | 40 | 50 | 63 | 2.5 | 20 | 63 | 4.54 | 4.59 | 4.63 |

TABLE 1-continued

| | UI (μm) | W₁ (μm) | W₂ (μm) | S (μm) | G (μm) | L (μm) | S1 (μm) | D (μm) | $\epsilon_T$ at 28 GHz | $\epsilon_T$ at 60 GHz | $\epsilon_T$ at 73 GHz |
|---|---|---|---|---|---|---|---|---|---|---|---|
| SW 4 | 120 | 80 | 40 | 50 | 63 | 2.5 | 30 | 52 | 3.94 | 3.95 | 3.97 |
| Straight | N/A | N/A | N/A | 50 | 63 | 2.5 | N/A | N/A | 3.26 | 3.25 | 3.25 |

Figure 11:
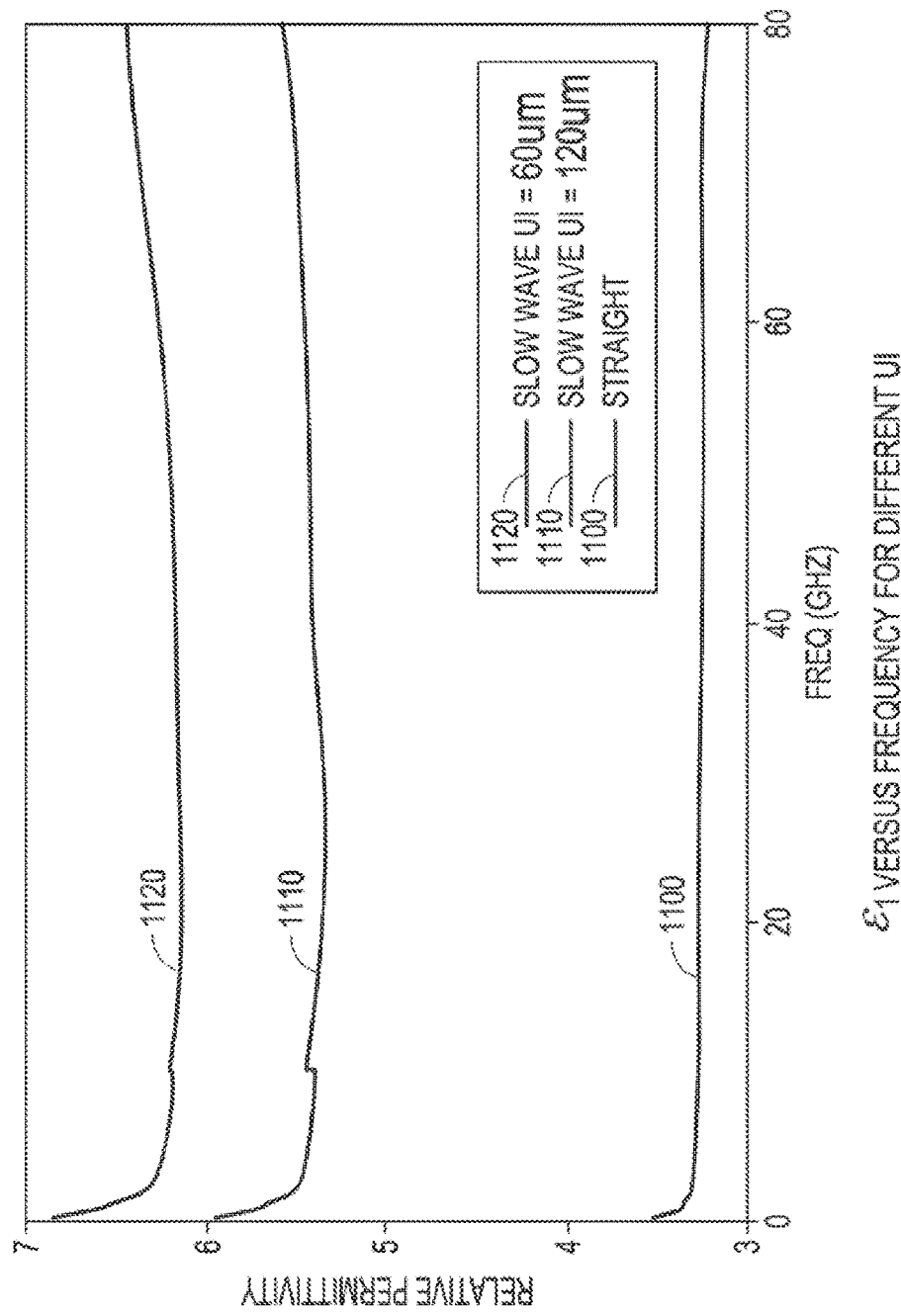
FIG. 11 illustrates variation of relative permittivity at two values of UI of FIG. 8 at different frequencies in accordance with some embodiments.

FIG. 11 illustrates variation of relative permittivity at two values of UI of FIG. 8 at different frequencies in accordance with some embodiments. FIG. 11 illustrates that for a given S1, $\epsilon_r$ increases with decreasing UI. Curves 1110 and 1120 illustrate the variation in permittivity for a slow wave structure with UI of 120 um and 60 um, over a wide range of frequencies, compared to a straight transmission line 1100. FIG. 11, in a way similar to FIG. 9, also demonstrates the wide band nature of the slow wave structure solution described herein.

Figure 12:
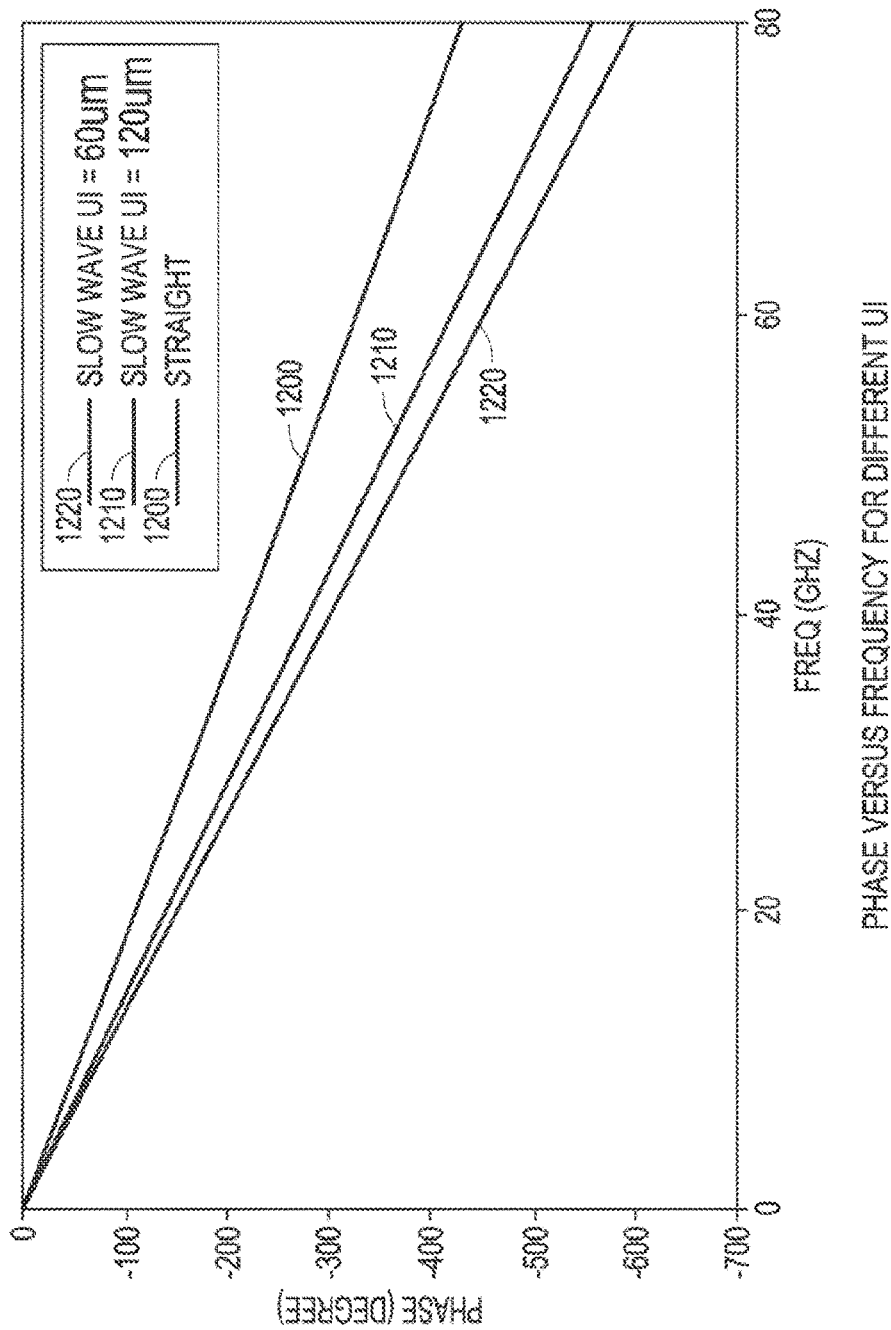
FIG. 12 illustrates variation of phase at two values of UI at different frequencies, as compared to a straight trace, in accordance with some embodiments.

FIG. 12 illustrates variation of phase at two values of UI, again, 60 um and 120 um, at different frequencies, as compared to a straight trace, in accordance with some embodiments. The similar behavior of curves 1110 and 1120 of FIG. 11 and curves 1210 and 1220 of FIG. 12, over a wide frequency range, again illustrates the broadband nature of the use of slow wave structures as described herein. The values for FIGS. 11 and 12 are seen in Table 2, below.

TABLE 2

| | UI (μm) | W₁ (μm) | W₂ (μm) | S (μm) | G (μm) | L (μm) | S1 (μm) | D (μm) | $\epsilon_T$ at 28 GHz | $\epsilon_T$ at 60 GHz | $\epsilon_T$ at 73 GHz |
|---|---|---|---|---|---|---|---|---|---|---|---|
| SW 1 | 60 | 40 | 20 | 50 | 63 | 2.5 | 10 | 63 | 6.17 | 6.29 | 6.38 |
| SW 2 | 120 | 80 | 40 | 50 | 63 | 2.5 | 10 | 72 | 5.35 | 5.46 | 5.52 |
| Straight | N/A | N/A | N/A | 50 | 63 | 2.5 | N/A | N/A | 3.26 | 3.25 | 3.25 |

Figure 12A:
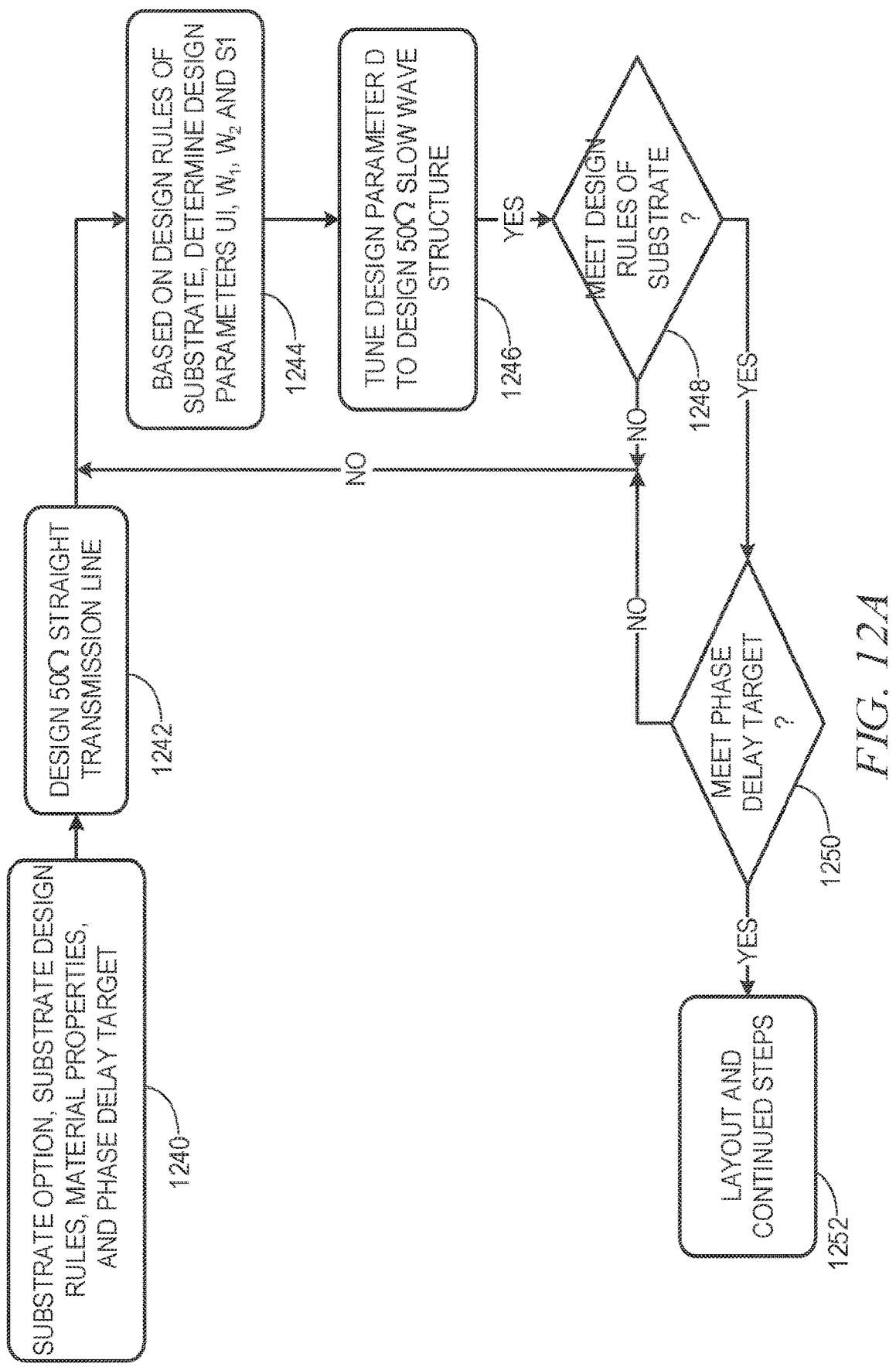
FIG. 12A is a flow chart illustrating a process for making a slow wave structure, according to some embodiments.

The parameters of Table 1 and Table 2 may be used in designing a slow wave structure to meet various requirements. FIG. 12A is a flow chart illustrating a process for making a slow wave structure, according to some embodiments. The illustrated design process is for use with simulation software. The simulation software used for the process described here is ANSYS HFSS v16.1.0 (the "simulation software"), where HFSS stands for High Frequency Structural Simulator. In step 1240, the substrate, substrate design rules, material properties of the substrate, and the phase delay target, are entered into the simulation software. In this context the term "substrate design rules" means basic guidelines for package design including minimum metal width/spacing, minimum drill to drill spacing, minimum pad size, and so on. At step 1242 a straight 50 ohm transmission line is designed in order to determine parameter G and S as a starting point to design a slow wave structure and serve as a comparison trace against which the slow wave structure will be designed and measured by the simulation software. Based on the design rules for the substrate involved, including its material properties and the phase delay target, referenced in step 1240, the simulation software determines the design parameters UI, W1, W2 and S1. Parameters that may be used by the simulation software during the design process are seen in Table 1 and Table 2, above. In step 1246 the design parameter D is optimized with HFSS to determine the characteristic impedance of the slow wave structure as close to 50 ohm as is realistically possible. At step 1248 the simulation software tests to determine whether the designed 50 ohm slow wave structure meets the design rules of the substrate. If the answer is No, steps 1244, 1246 and 1248 are repeated until the substrate design rules are met. If the substrate design rules are met in determination 1248, the simulation software makes the determination of whether the phase delay target has been met. If the answer at 1250 is No (phase delay target not met), then steps 1244, 1246, 1248 and 1250 are repeated until the phase delay target is met, indicated by the Yes decision out of step 1250. At step 1252 the PCB layout and other PCB process steps continue.

Figure 13:
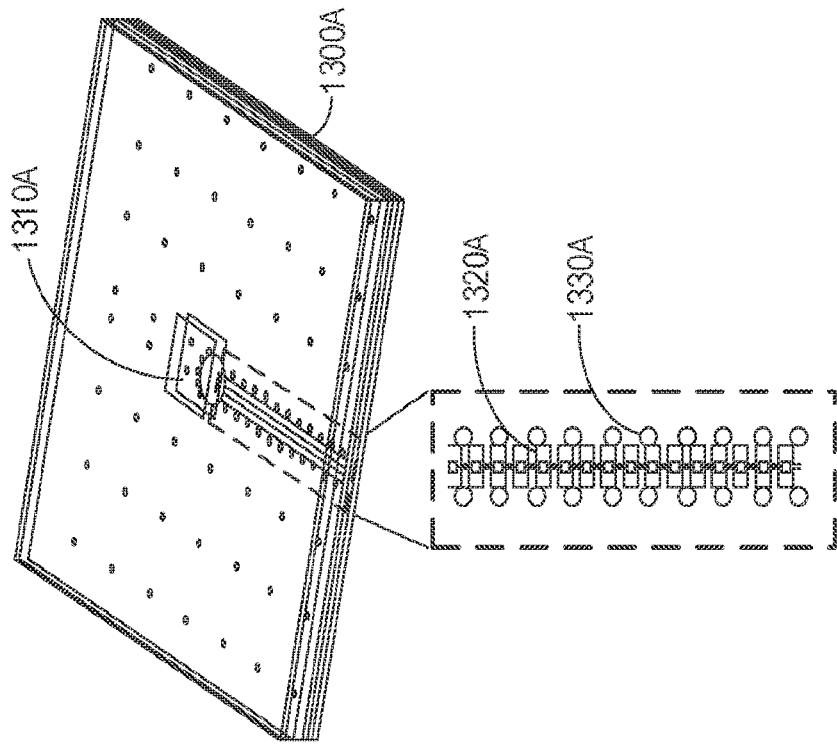
FIG. 13 illustrates an antenna with a 2.5 mm conventional transmission line feed and with a 1.9 mm slow wave structure feed in accordance with some embodiments.
Figure 13:
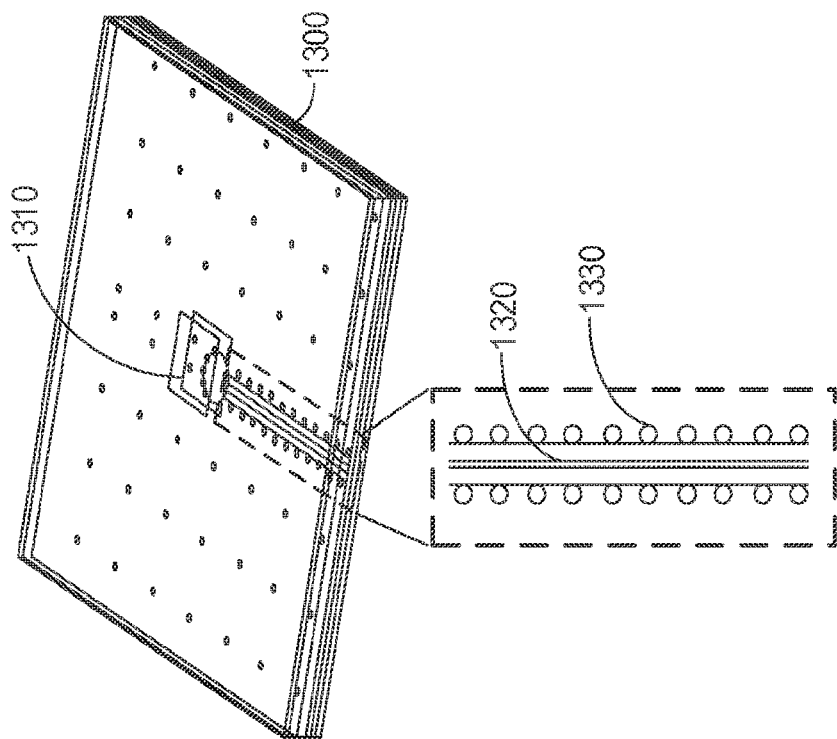

FIG. 13 illustrates an antenna with a 2.5 mm conventional transmission line feed and with a 1.9 mm slow wave structure feed in accordance with some embodiments. As indicated by the description and graphs above, a shorter slow wave structure is expected to provide the same phase delay and comparable loss as the longer conventional transmission line feed.

Antenna 1310 is situated on or within printed circuit board (PCB) 1300. Illustrated in dash line is a magnified view of the feed line 1320 on PCB 1300. Feed line 1320 is a conventional transmission line such as a strip line or trace. Ground vias 1330 stitch the PCB GND layers that reference the strip line feed 1320. Antenna 1310A is situated on or within PCB 1300A. Illustrated in dash line is a magnified view of the feed line 1320A on PCB 1300A. Feed line 1320A is slow wave structure whose dimensions are determined by simulation to provide the appropriate dimension and (if there were dual feeds required to arrive at the antenna) at the same time and phase, length and phase matching. Ground vias 1330A again stitch the PCB GND layers that reference the slow wave structure feed 1320A. The antenna may be configured to operate in a 5G environment, although the slow wave structure discussed here is not limited to 5G. A slow wave structure similar to that discussed with respect to FIG. 12A can be used for feed line 1320A, and may find use in phase management in 5G millimeter wave beamsteering antenna arrays and digital signaling design, among other applications.

Figure 14:
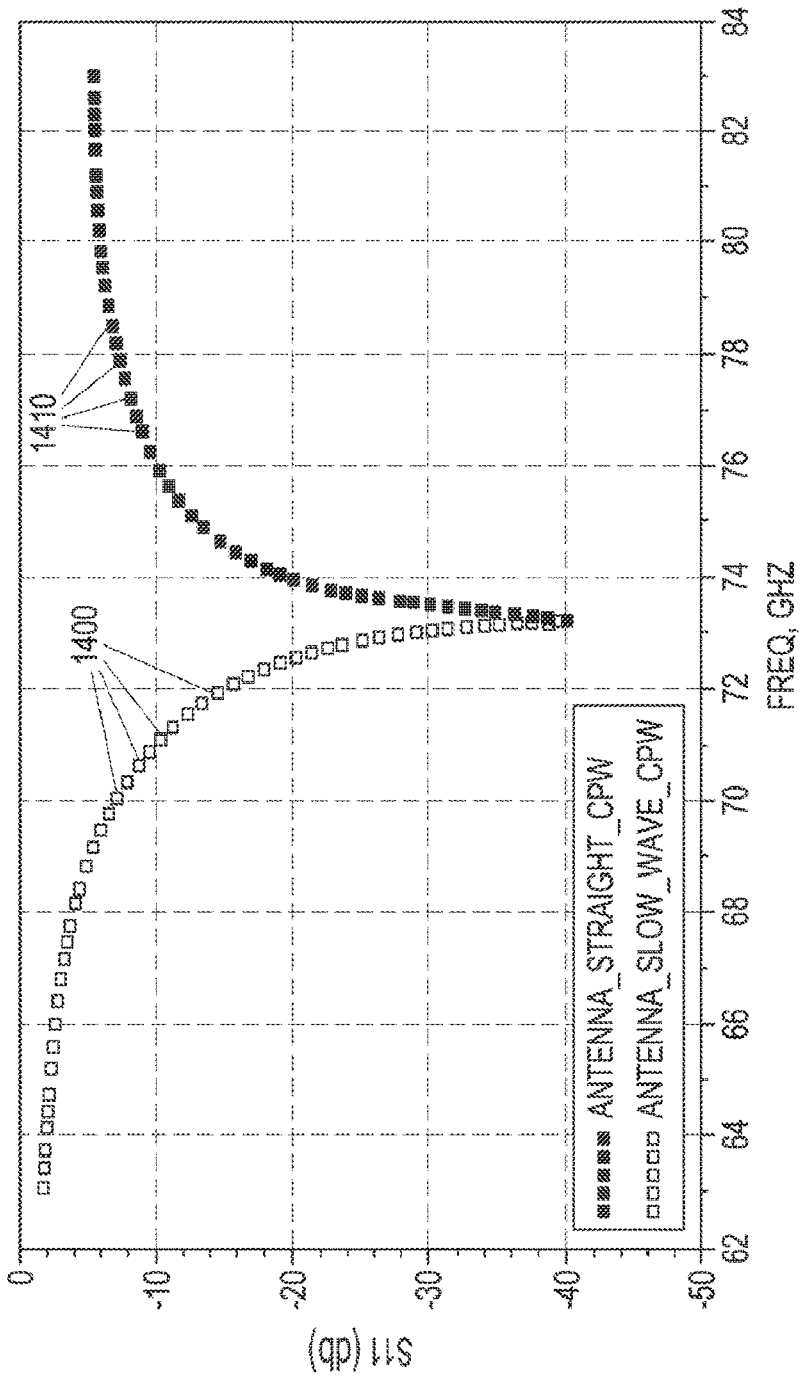
FIG. 14 illustrates a return loss comparison with the conventional transmission line feed and the slow wave structure feed of FIG. 13 in accordance with some embodiments.

FIG. 14 illustrates a return loss comparison with the conventional transmission line feed and the slow wave structure feed of FIG. 13 in accordance with some embodiments. Curve 1400 illustrates the straight co-planar waveguide (CPW) which is coded in box 1402, while curve 1410 illustrates a slow wave CPW. FIG. 14 illustrates a return loss comparison with the conventional transmission line feed and the slow wave structure feed of FIG. 13 in accordance with some embodiments. FIG. 14 shows that similar return loss bandwidth can be achieved with a slow wave structure feed as with a straight co-planar waveguide, or a trace.

Figure 15:
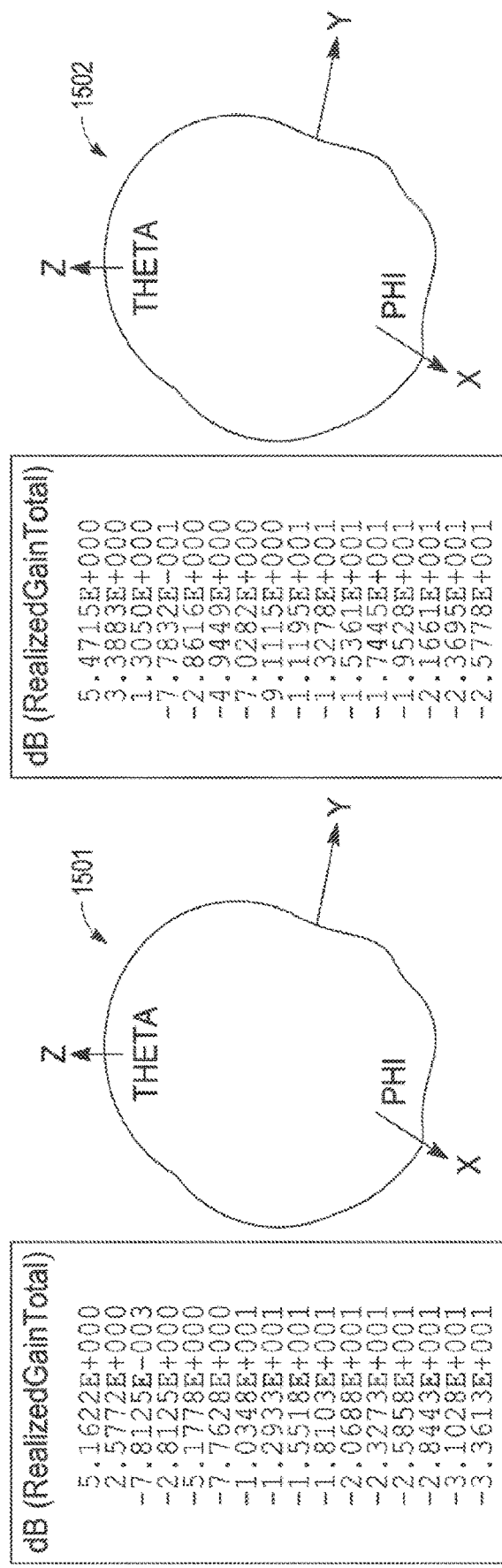
FIG. 15 illustrates a realized gain comparisons of antennas with a conventional transmission line feed and with a slow wave structure feed, in accordance with some embodiments.

FIG. 15 illustrates realized gain comparisons of antennas with a conventional transmission line feed and with a slow wave structure feed, in accordance with some embodiments. Realized gain for the pattern illustrated at 1501 is realized gain for the conventional transmission line feedline case at 1320 of FIG. 13, with a maximum realized gain of 5.16. Realized gain for the pattern at 1502 is realized gain for the slow wave structure feedline case at 1320A of FIG. 13, with a maximum realized gain of 5.47. Both patterns were realized through simulation. FIG. 15 shows that comparable or slightly better gain is achieved with a slow wave structure. This indicates that the shorter slow structure routing doesn't impact the antenna performance while providing a 0.6 mm (25%) length reduction.

An example of dimensions of a slow wave structure for the above antenna will now be given. For example, from Table 1, if a slow wave structure operating at 60 GHz and a length L of 2.5 mm is desired, to connect from a first point to a second point, an $\varepsilon_r$ of 5.46 can be used in order to delay the signal to meet the specified length match desired. In this example the following are substantially the dimensions for the slow wave structure in FIG. 8:

D=72 um
UI=120 um (comprising W1=80 um and W2=40 um)
S=50 um
G=63 um
S1=10 um

In the above case, a 1.9 mm slow wave has the same phase delay as 2.5 mm conventional transmission line. In other words, in the example where a slow wave structure operating at 60 GHz and a length L of 2.5 mm is desired, to connect from a first point to a second point, the designer may use $\varepsilon_r$ of 5.46, $\varepsilon_r$ of 6.19 or any slow wave structure listed in Table 1 to meet the specified length match. The difference among these cases is the length of slow wave structure. Higher effective relative permittivity requires shorter length to meet the target.

The phase velocity depends on the relative permittivity of the dielectric. Phase velocity is given as $\upsilon p = c/\sqrt{(\mu_r \times \varepsilon_r)}$ (i.e. divided by the square root of $\mu_r \times \varepsilon_r$) where $\mu_r$ is the relative magnetic permeability of the dielectric and $\varepsilon_r$ is the relative permittivity of the dielectric. The phase delay is the time delay of the phase and is calculated from the length of transmission line 1 and phase velocity vp, i.e., time delay=1/vp. So the initial length of the slow wave structure can be obtained based on the specified length value and the effective relative permittivity of the slow wave structure. Then, the tuning process is done in HFSS to optimize or improve the length of the slow wave structure to achieve the same phase delay as the conventional transmission line.

Figure 16:
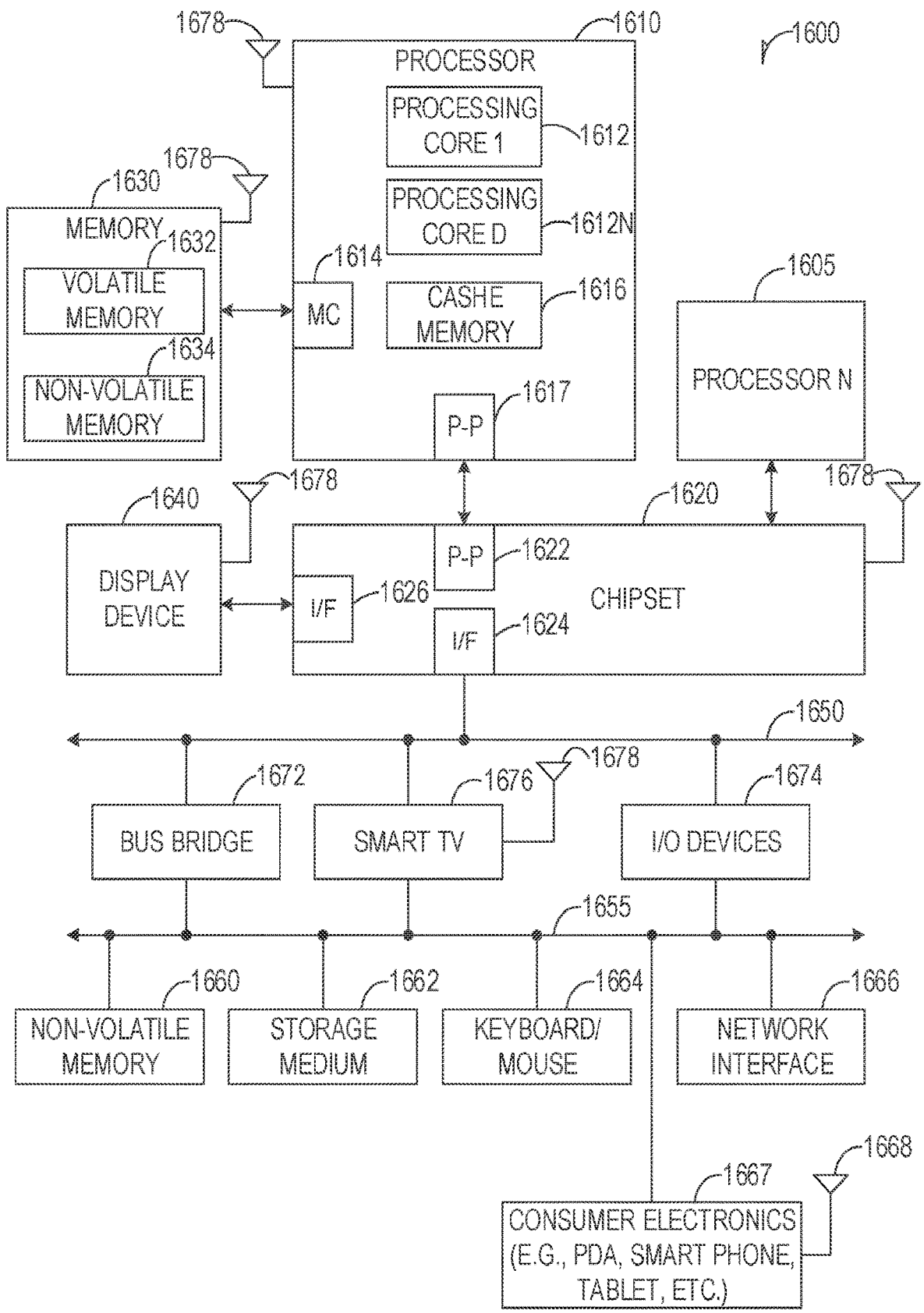
FIG. 16 illustrates a system level diagram, depicting an example of an electronic device (e.g., system) including one or more integrated circuits that implement slow wave structure for phase and length matching in accordance with some embodiments.

FIG. 16 illustrates a system level diagram, depicting an example of an electronic device (e.g., system) including one or more integrated circuits that implement slow wave structure for phase and length matching as described in the present disclosure. FIG. 16 is included to show an example of a higher level device application for integrated circuits employing phase and length matching using slow wave structures. In one embodiment, system 1600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1600 is a system on a chip (SOC) system.

In one embodiment, processor 1610 has one or more processor cores 1612 and 1612N, where 1612N represents the Nth processor core inside processor 1610 where N is a positive integer. In one embodiment, system 1600 includes multiple processors including 1610 and 1605, where processor 1605 has logic similar or identical to the logic of processor 1610. In some embodiments, processing core 1612 includes, but is not limited to, pre-fetch logic to fetch instructions, decode logic to decode the instructions, execution logic to execute instructions and the like. In some embodiments, processor 1610 has a cache memory 1616 to cache instructions and/or data for system 1600. Cache memory 1616 may be organized into a hierarchal structure including one or more levels of cache memory.

In some embodiments, processor 1610 includes a memory controller 1614, which is operable to perform functions that enable the processor 1610 to access and communicate with memory 1630 that includes a volatile memory 1632 and/or a non-volatile memory 1634. In some embodiments, processor 1610 is coupled with memory 1630 and chipset 1620. Processor 1610 may also be coupled to a wireless antenna 1678 to communicate with any device configured to transmit and/or receive wireless signals. In one embodiment, an interface for wireless antenna 1678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1634 includes, but is not limited to, flash memory, phase change memory (PCM), read-only memory (ROM), electrically erasable programmable read-only memory (EEPROM), or any other type of non-volatile memory device.

Memory 1630 stores information and instructions to be executed by processor 1610. In one embodiment, memory 1630 may also store temporary variables or other intermediate information while processor 1610 is executing instructions. In the illustrated embodiment, chipset 1620 connects with processor 1610 via Point-to-Point (PtP or P-P) interfaces 1617 and 1622. Chipset 1620 enables processor 1610 to connect to other elements in system 1600. In some embodiments of the example system, interfaces 1617 and 1622 operate in accordance with a PtP communication protocol such as the Intel® QuickPath Interconnect (QPI) or the like. In other embodiments, a different interconnect may be used.

In some embodiments, chipset 1620 is operable to communicate with processor 1610, 1605N, display device 1640, and other devices, including a bus bridge 1672, a smart TV 1676, I/O devices 1674, nonvolatile memory 1660, a storage medium (such as one or more mass storage devices) [this is the term in Fig-alternative to revise Fig. to "mass storage device(s)"-as used in para. 8] 1662, a keyboard/mouse 1664, a network interface 1666, and various forms of consumer electronics 1677 (such as a FDA, smart phone, tablet etc.), etc. In one embodiment, chipset 1620 couples with these devices through an interface 1624. Chipset 1620 may also be coupled to a wireless antenna 1678 to communicate with any device configured to transmit and/or receive wireless signals.

Chipset 1620 connects to display device 1640 via interface 1626. Display 1640 may be, for example, a liquid crystal display (LCD), a plasma display, cathode ray tube (CRT) display, or any other form of visual display device. In some embodiments of the example system, processor 1610 and chipset 1620 are merged into a single SOC. In addition, chipset 1620 connects to one or more buses 1650 and 1655 that interconnect various system elements, such as I/O devices 1674, nonvolatile memory 1660, storage medium 1662, a keyboard/mouse 1664, and network interface 1666. Buses 1650 and 1655 may be interconnected together via a bus bridge 1672.

In one embodiment, mass storage device 1662 includes, but is not limited to, a solid state drive, a hard disk drive, a universal serial bus flash memory drive, or any other form of computer data storage medium. In one embodiment, network interface 1666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 16 are depicted as separate blocks within the system 1600, the functions performed by some of these blocks may be integrated within a single semiconductor circuit or may be implemented using two or more separate integrated circuits. For example, although cache memory 1616 is depicted as a separate block within processor 1610, cache memory 1616 (or selected aspects of 1616) can be incorporated into processor core 1612.

Figure 17:
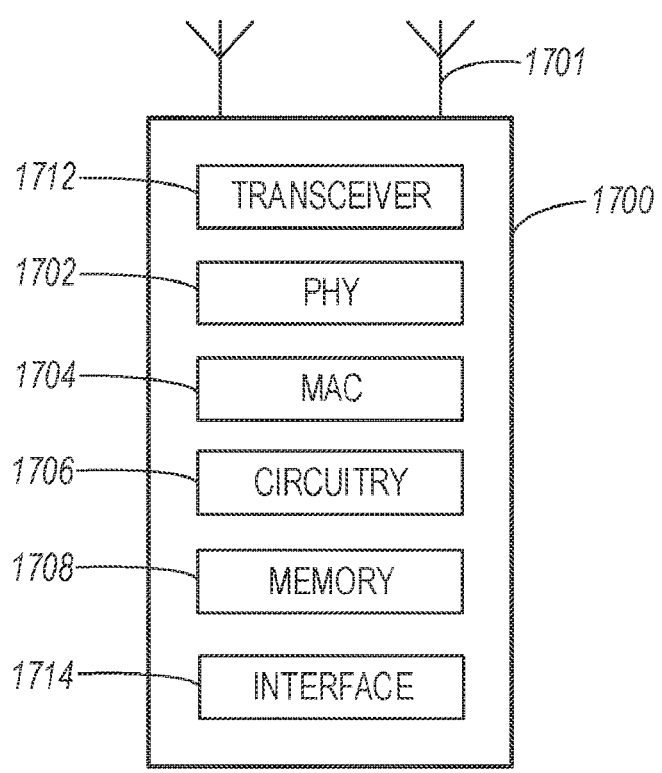
FIG. 17 illustrates a functional block diagram of a communication platform such as a mobile device with which the phase and length matching using slow wave structures may be used in accordance with some embodiments.

FIG. 17 illustrates a functional block diagram of a communication platform 1700 such as a mobile device with which the phase and length matching using slow wave structures described herein may be used, in accordance with some embodiments. In some embodiments the communication platform may be UE configured to operation in a mobile communication network, such as a 3GPP LTE network, while in other embodiments, the communication platform may be a communication station (STA) configured to operation in a Wi-Fi network. In some embodiments the communication platform may be a mobile device be configured for operation in millimeter-wave (mmWave) communication, particularly in mobile communication standards, such as 5G.

The embodiments are not limited to 3GPP LTE networks, or Wi-Fi networks, or networks employing the 5G standard. In accordance with some embodiments, the open systems interconnection media access control (MAC) circuitry 1704 may be arranged to contend for a wireless medium configure frames or packets for communicating over the wireless medium and the physical layer (PHY) circuitry 1702 may be arranged to transmit and receive signals. The PHY 1702 may include circuitry for modulation/demodulation, upconversion/downconversion, filtering, amplification, etc. In some embodiments, the processing circuitry 1706 of the UE 1700 may include one or more processors. In some embodiments, two or more antennas may be coupled to the physical layer circuitry arranged for sending and receiving signals. The memory 1708 may be store information for configuring the processing circuitry 1706 to perform operations for configuring and transmitting UE frames and performing the various operations described herein. Interface 1704 and transceiver 1712 may also be provided, the interface for interfacing with various of the components described, and the transceiver for generating transmit signals for transmission by antennas 1701 and processing receive signals received by antennas 1701.

In some embodiments, the communication platform 1700 may be part of a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a medical device (e.g., a heart rate monitor, a blood pressure monitor, etc.), or other device that may receive and/or transmit information wirelessly. In some embodiments, the platform 1700 may include one or more of a keyboard, a display, a non-volatile memory port, multiple antennas, a graphics processor, an application processor, speakers, and other mobile device elements. The display may be a liquid crystal display (LCD) screen including a touch screen.

The one or more antennas 1701 utilized by the communication platform 1700 may comprise one or more directional or omnidirectional antennas, including, for example, dipole antennas, monopole antennas, patch antennas, loop antennas, microstrip antennas or other types of antennas suitable for transmission of RF signals. In some embodiments, instead of two or more antennas, a single antenna with multiple apertures may be used. In these embodiments, each aperture may be considered a separate antenna. In some MIMO embodiments, the antennas may be effectively separated to take advantage of spatial diversity and the different channel characteristics that may result between each of antennas and the antennas of a transmitting station. In some MIMO embodiments, the antennas may be separated by up to $\frac{1}{10}$ of a wavelength or more.

Embodiments may be implemented in one or a combination of hardware, firmware and software. Embodiments may also be implemented as instructions stored on a computer-readable storage medium, which may be read and executed by at least one processor to perform the operations described herein. A computer-readable storage medium may include any non-transitory mechanism for storing information in a form readable by a machine (e.g., a computer). For example, a computer-readable storage medium may include read-only memory (ROM), random-access memory (RAM), magnetic disk storage media, optical storage media, flash-memory devices, and other storage devices and media. In these embodiments, one or more processors may be configured with the instructions to perform the operations described herein.

In some embodiments, the communication platform 1700 may be configured to receive orthogonal frequency division multiplexing (OFDM) communication signals over a multicarrier communication channel in accordance with an orthogonal frequency division multiple access (OFDMA) communication technique. The OFDM signals may comprise a plurality of orthogonal subcarriers. In some broadband multicarrier embodiments, Evolved Node Bs (eNBs) may be part of a broadband wireless access (BWA) network communication network, such as a Worldwide Interoperability for Microwave Access (WiMAX) communication network or a 3rd Generation Partnership Project (3GPP) Universal Terrestrial Radio Access Network (UTRAN) Long-Term-Evolution (LTE) or a Long-Term-Evolution (LTE) communication network, although the scope of the invention is not limited in this respect. In these broadband multicarrier embodiments, the platform 1700 and the eNBs may be configured to communicate in accordance with an OFDMA technique.

Although the communication platform 1700 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), radio-frequency integrated circuits (RFICs), radio-frequency integrated circuits (RFICs) and combinations of various hardware and logic circuitry for performing at least the functions described herein. In some embodiments, the functional elements may refer to one or more processes operating on one or more processing elements.

Figure 18:
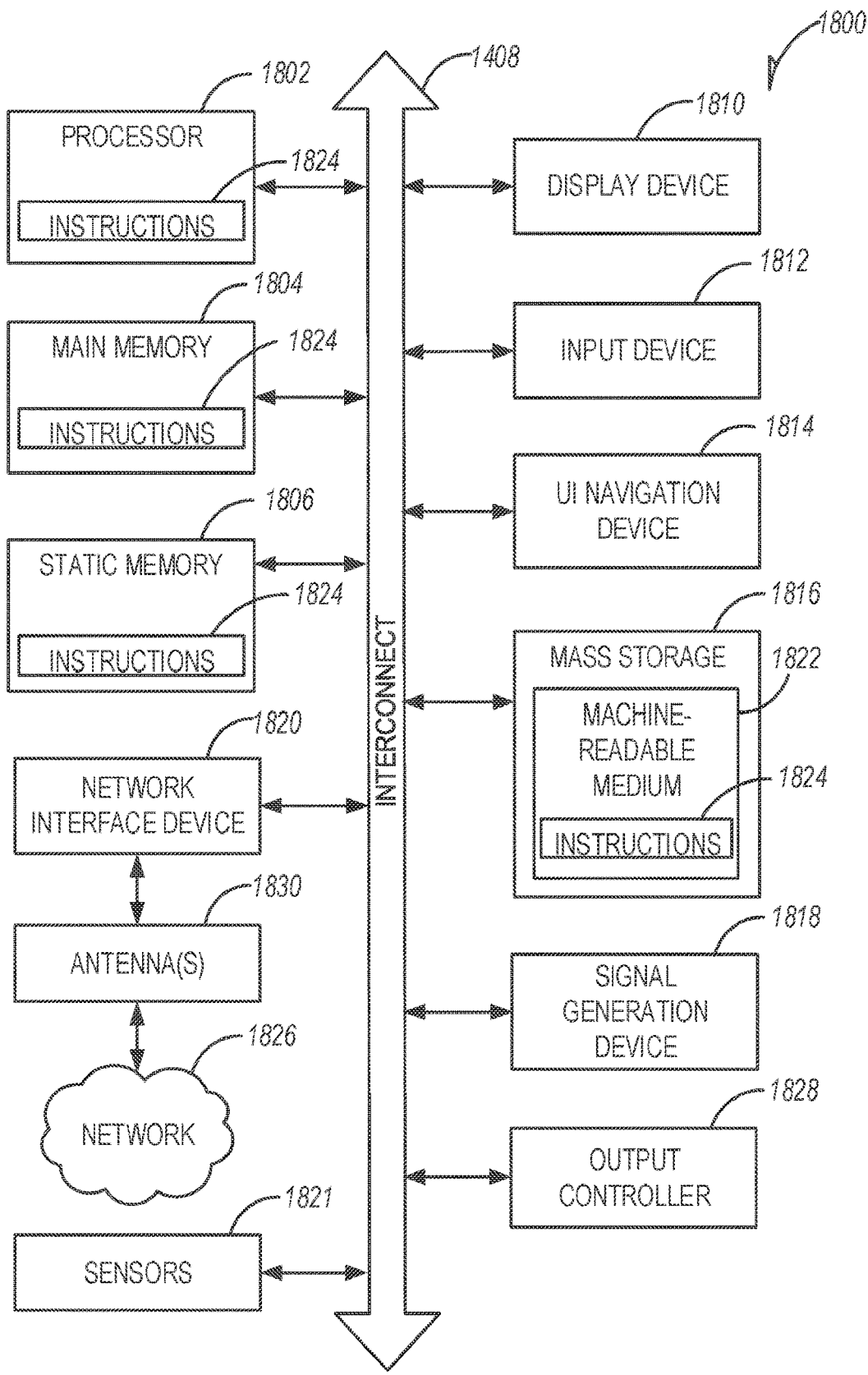
FIG. 18 illustrates a block diagram of an example machine upon which any one or more of the techniques discussed herein may be performed.

FIG. 18 illustrates a block diagram of an example machine 1850 upon which any one or more of the techniques (e.g., methodologies) discussed herein may be performed. In alternative embodiments, the machine 1850 may operate as a standalone device or may be connected (e.g., networked) to other machines. In a networked deployment, the machine 1850 may operate in the capacity of a server machine, a client machine, or both in server-client network environments. In an example, the machine 1850 may act as a peer machine in peer-to-peer (P2P) (or other distributed) network environment. The machine 1850 may be a <UE/eNodeB/AP/STA/ETC>, personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Machine (e.g., computer system) may include a hardware processor 1802 (e.g., a central processing unit (CPU), a graphics processing unit (GPU), a hardware processor core, or any combination thereof), a main memory 1804 and a static memory 1806, some or all of which may communicate with each other via an interlink (e.g., bus) 1808. The machine 1850 may further include a display unit 1810, an alphanumeric input device 1812 (e.g., a keyboard), and a user interface (UI) navigation device 1814 (e.g., a mouse). In an example, the display unit 1810, input device 1812 and UI navigation device 1814 may be a touch screen display. The machine 1850 may additionally include a storage device (e.g., drive unit) 1816, a signal generation device 1818 (e.g., a speaker), a network interface device 1820, and one or more sensors, such as a global positioning system (GPS) sensor, compass, accelerometer, or other sensor. The machine 1850 may include an output controller 1828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1816 may include a machine readable medium 1822 on which is stored one or more sets of data structures or instructions 1824 (e.g., software) embodying or utilized by any one or more of the techniques or functions described herein. The instructions 1824 may also reside, completely or at least partially, within the main memory 1804, within static memory 1806, or within the hardware processor 1802 during execution thereof by the machine. In an example, one or any combination of the hardware processor 1802, the main memory 1804, the static memory 1806, or the storage device 1816 may constitute machine readable media.

While the machine readable medium 1822 is illustrated as a single medium, the term "machine readable medium" may include a single medium or multiple media (e.g., a centralized or distributed database, and/or associated caches and servers) configured to store the one or more instructions 1824.

The term "machine readable medium" may include any medium that is capable of storing, encoding, or carrying instructions for execution by the machine and that cause the machine to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine readable media may include non-transitory machine readable media. In some examples, machine readable media may include machine readable media that is not a transitory propagating signal.

The instructions 1824 may further be transmitted or received over a communications network 1826 using a transmission medium via the network interface device 1820 utilizing any one of a number of transfer protocols (e.g., frame relay, interne protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 1820 may include one or more physical jacks (e.g., Ethernet, coaxial, or phone jacks) or one or more antennas to connect to the communications network 1826. In an example, the network interface device 1820 may include a plurality of antennas to wirelessly communicate using at least one of single-input multiple-output (SIMO), multiple-input multiple-output (MIMO), or multiple-input single-output (MISO) techniques. In some examples, the network interface device 1820 may wirelessly communicate using Multiple User MIMO techniques. The term "transmission medium" shall be taken to include any intangible medium that is capable of storing, encoding or carrying instructions for execution by the machine, and includes digital or analog communications signals or other intangible medium to facilitate communication of such software.

EXAMPLES

Example 1 is a printed circuit board comprising: a first layer and a second layer substantially parallel to and spaced apart from the first layer; and an integrated circuit (IC) connected to the first layer and configured to provide a first electronic signal over a first conductive path between a first pair of conductive points and a second electronic signal over a second conductive path between a second pair of conductive points, wherein a first slow wave structure comprises the first conductive path and a second slow wave structure comprises the second conductive path.

In Example 2, the subject matter of Example 1 optionally includes wherein the first pair of conductive points comprises a first conductive point that is coupled to the transceiver and a second conductive point that is coupled to a first antenna element, and the second pair of conductive points comprises a third conductive point that is coupled to the transceiver and a fourth conductive point that is coupled to a second antenna element, wherein the effective relative permittivity of the first slow wave structure is tuned such that the first electronic signal arrives at the second conductive point at a first time, and wherein the effective relative permittivity of the second slow wave structure is tuned such that the second electronic signal arrives at the fourth conductive point at a second time.

In Example 3, the subject matter of Example 2 optionally includes wherein the first time is substantially equal to the second time.

In Example 4, the subject matter of any one or more of Examples 2-3 optionally include wherein the effective relative permittivity of the first slow wave structure is further tuned such that the first electronic signal arrives at the second conductive point at a predetermined phase of the first signal, and wherein the effective relative permittivity of the second slow wave structure is further tuned such that the second electronic signal arrives at the fourth conductive point at a predetermined phase of the second signal.

In Example 5, the subject matter of Example 4 optionally includes wherein the predetermined phase of the first signal is substantially equal to the predetermined phase of the second signal.

In Example 6, the subject matter of any one or more of Examples 2-5 optionally include wherein the first slow wave structure comprises a plurality of unit cells each having a narrow section and a unit length, and selection of the dimensions of the narrow section and of the unit length of the first slow wave structure tunes the effective relative permittivity of the first slow wave structure such that the first signal arrives at the second conductive point at the first time and at the predetermined phase of the first signal, and wherein the second slow wave structure comprises a plurality of unit cells each having a narrow section and a unit length, and selection of the dimensions of the narrow section and of the unit length of the second slow wave structure tunes the effective relative permittivity of the second slow wave structure such that the second signal arrives at the fourth conductive point at the second time and at the predetermined phase of the second signal.

In Example 7, the subject matter of any one or more of Examples 4-6 optionally include wherein the first slow wave structure comprises a plurality of unit cells each having a narrow section and a unit length, and selection of the dimensions of the narrow section and of the unit length of the first slow wave structure tunes the effective relative permittivity of the first slow wave structure such that the first signal arrives at the second conductive point at the first time and at the predetermined phase of the first signal, and wherein the second slow wave structure comprises a plurality of unit cells each having a narrow section and a unit length, and selection of the dimensions of the narrow section and of the unit length of the second slow wave structure tunes the effective relative permittivity of the second slow wave structure such that the second signal arrives at the fourth conductive point at the second time and at the predetermined phase of the second signal.

Example 8 is a mobile device comprising: a printed circuit board (PCB) having a first layer and a second layer substantially parallel to and spaced apart from the first layer; and an integrated circuit (IC) comprising a transceiver configured to receive radio frequency signals via a downlink from an access point, the transceiver connected to the first layer and configured to provide a first electronic signal over a first conductive path between a first pair of conductive points and a second electronic signal over a second conductive path between a second pair of conductive points, wherein a first slow wave structure comprises the first conductive path and a second slow wave structure comprises the second conductive path.

In Example 9, the subject matter of Example 8 optionally includes wherein the first pair of conductive points comprises a first conductive point that is coupled to the transceiver and a second conductive point that is coupled to a first antenna element, and the second pair of conductive points comprises a third conductive point that is coupled to the transceiver and a fourth conductive point that is coupled to a second antenna element, wherein the effective relative permittivity of the first slow wave structure is tuned such that the first electronic signal arrives at the second conductive point at a first time, and wherein the effective relative permittivity of the second slow wave structure is tuned such that the second electronic signal arrives at the fourth conductive point at a second time.

In Example 10, the subject matter of Example 9 optionally includes wherein the first time is substantially equal to the second time.

In Example 11, the subject matter of any one or more of Examples 9-10 optionally include wherein the effective relative permittivity of the first slow wave structure is further tuned such that the first electronic signal arrives at the second conductive point at a predetermined phase of the first signal, and wherein the effective relative permittivity of the second slow wave structure is further tuned such that the second electronic signal arrives at the fourth conductive point at a predetermined phase of the second signal.

In Example 12, the subject matter of Example 11 optionally includes wherein the predetermined phase of the first signal is substantially equal to the predetermined phase of the second signal.

In Example 13, the subject matter of any one or more of Examples 9-12 optionally include wherein the first slow wave structure comprises a plurality of unit cells each having a narrow section and a unit length, and selection of the dimensions of the narrow section and of the unit length of the first slow wave structure tunes the effective relative permittivity of the first slow wave structure such that the first signal arrives at the second conductive point at the first time and at the predetermined phase of the first signal, and wherein the second slow wave structure comprises a plurality of unit cells each having a narrow section and a unit length, and selection of the dimensions of the narrow section and of the unit length of the second slow wave structure tunes the effective relative permittivity of the second slow wave structure such that the second signal arrives at the fourth conductive point at the second time and at the predetermined phase of the second signal.

In Example 14, the subject matter of any one or more of Examples 11-13 optionally include wherein the first slow wave structure comprises a plurality of unit cells each having a narrow section and a unit length, and selection of the dimensions of the narrow section and of the unit length of the first slow wave structure tunes the effective relative permittivity of the first slow wave structure such that the first signal arrives at the second conductive point at the first time and at the predetermined phase of the first signal, and wherein the second slow wave structure comprises a plurality of unit cells each having a narrow section and a unit length, and selection of the dimensions of the narrow section and of the unit length of the second slow wave structure tunes the effective relative permittivity of the second slow wave structure such that the second signal arrives at the fourth conductive point at the second time and at the predetermined phase of the second signal.

In Example 15, the subject matter of any one or more of Examples 10-14 optionally include wherein the first signal is at a first polarity and the second signal is at a second polarity.

Example 16 is a base station comprising: a printed circuit board (PCB) having a first layer and a second layer substantially parallel to and separated from the first layer; and an integrated circuit (IC) transceiver comprising a plurality of antenna feeds for an antenna array for downlink radio signal transmission, at least some of the plurality of antenna feeds being connected to the first layer and configured to provide a first electronic signal over a first conductive path between a first pair of conductive points and a second electronic signal over a second conductive path between a second pair of conductive points, wherein a first slow wave structure comprises the first conductive path and a second slow wave structure comprises the second conductive path.

In Example 17, the subject matter of Example 16 optionally includes wherein the first pair of conductive points comprises a first conductive point that is coupled to a first antenna feed of the plurality of antenna feeds and a second conductive point that is coupled to a first antenna element, and the second pair of conductive points comprises a third conductive point that is coupled to a second antenna feed of the plurality of antenna feeds and a fourth conductive point that is coupled to a second antenna element, wherein the effective relative permittivity of the first slow wave structure is tuned such that the first electronic signal arrives at the second conductive point at a first time, and wherein the effective relative permittivity of the second slow wave structure is tuned such that the second electronic signal arrives at the fourth conductive point at a second time.

In Example 18, the subject matter of Example 17 optionally includes wherein the first time is substantially equal to the second time.

In Example 19, the subject matter of any one or more of Examples 17-18 optionally include wherein the effective relative permittivity of the first slow wave structure is further tuned such that the first electronic signal arrives at the second conductive point at a predetermined phase of the first signal, and wherein the effective relative permittivity of the second slow wave structure is further tuned such that the second electronic signal arrives at the fourth conductive point at a predetermined phase of the second signal.

In Example 20, the subject matter of Example 19 optionally includes wherein the predetermined phase of the first signal is substantially equal to the predetermined phase of the second signal.

In Example 21, the subject matter of any one or more of Examples 17-20 optionally include wherein the first slow wave structure comprises a plurality of unit cells each having a narrow section and a unit length, and selection of the dimensions of the narrow section and of the unit length of the first slow wave structure tunes the effective relative permittivity of the first slow wave structure such that the first signal arrives at the second conductive point at the first time and at the predetermined phase of the first signal, and wherein the second slow wave structure comprises a plurality of unit cells each having a narrow section and a unit length, and selection of the dimensions of the narrow section and of the unit length of the second slow wave structure tunes the effective relative permittivity of the second slow wave structure such that the second signal arrives at the fourth conductive point at the second time and at the predetermined phase of the second signal.

In Example 22, the subject matter of any one or more of Examples 19-21 optionally include wherein the first slow wave structure comprises a plurality of unit cells each having a narrow section and a unit length, and selection of the dimensions of the narrow section and of the unit length of the first slow wave structure tunes the effective relative permittivity of the first slow wave structure such that the first signal arrives at the second conductive point at the first time and at the predetermined phase of the first signal, and wherein the second slow wave structure comprises a plurality of unit cells each having a narrow section and a unit length, and selection of the dimensions of the narrow section and of the unit length of the second slow wave structure tunes the effective relative permittivity of the second slow wave structure such that the second signal arrives at the fourth conductive point at the second time and at the predetermined phase of the second signal.

In Example 23, the subject matter of any one or more of Examples 17-22 optionally include wherein the first signal is at a first polarity and the second signal is at a second polarity.

Example 24 is an electronic system comprising: a printed circuit board (PCB) having a first layer and a second layer substantially parallel to the first layer; and an integrated circuit (IC) connected to the first layer and configured to provide a first electronic signal over a first conductive path between a first pair of conductive points and a second electronic signal over a second conductive path between a second pair of conductive points, wherein a first slow wave structure comprises the first conductive path and a second slow wave structure comprises the second conductive path.

In Example 25, the subject matter of Example 24 optionally includes wherein the first pair of conductive points comprises a first conductive point and a second conductive point, and the second conductive pair of conductive points comprises a third conductive point and a fourth conductive point, wherein the effective relative permittivity of the first slow wave structure is tuned such that the first electronic signal arrives at the second conductive point at a first time, and wherein the effective relative permittivity of the second slow wave structure is tuned such that the second electronic signal arrives at the fourth conductive point at a second time.

In Example 26, the subject matter of Example 25 optionally includes wherein the first time is substantially equal to the second time.

In Example 27, the subject matter of any one or more of Examples 25-26 optionally include wherein the effective relative permittivity of the first slow wave structure is further tuned such that the first electronic signal arrives at the second conductive point at a predetermined phase of the first signal, and wherein he effective relative permittivity of the second slow wave structure is further tuned such that the second electronic signal arrives at the fourth conductive point at a predetermined phase of the second signal.

In Example 28, the subject matter of Example 27 optionally includes wherein the predetermined phase of the first signal is substantially equal to the predetermined phase of the second signal.

In Example 29, the subject matter of any one or more of Examples 25-28 optionally include wherein the first slow wave structure comprises a plurality of unit cells each having a narrow section and a unit length, and selection of the dimensions of the narrow section and of the unit length of the first slow wave structure tunes the effective relative permittivity of the first slow wave structure such that the first signal arrives at the second conductive point at the first time and at the predetermined phase of the first signal, and wherein the second slow wave structure comprises a plurality of unit cells each having a narrow section and a unit length, and selection of the dimensions of the narrow section and of the unit length of the second slow wave structure tunes the effective relative permittivity of the second slow wave structure such that the second signal arrives at the fourth conductive point at the second time and at the predetermined phase of the second signal.

In Example 30, the subject matter of any one or more of Examples 27-29 optionally include wherein the first slow wave structure comprises a plurality of unit cells each having a narrow section and a unit length, and selection of the dimensions of the narrow section and of the unit length of the first slow wave structure tunes the effective relative permittivity of the first slow wave structure such that the first signal arrives at the second conductive point at the first time and at the predetermined phase of the first signal, and wherein the second slow wave structure comprises a plurality of unit cells each having a narrow section and a unit length, and selection of the dimensions of the narrow section and of the unit length of the second slow wave structure tunes the effective relative permittivity of the second slow wave structure such that the second signal arrives at the fourth conductive point at the second time and at the predetermined phase of the second signal.

In Example 31, the subject matter can include, or can optionally be combined with any portion or combination of, any portions of any one or more of Examples 1 through 30 to include, subject matter that can include means for performing any one or more of the functions of Examples 1 through 30, or a machine-readable medium including instructions that, when performed by a machine, cause the machine to perform any one or more of the functions of Examples 1 through 30.

All features of the apparatuses described above (including optional features) may also be implemented with respect to the methods or processes described herein.

The invention claimed is:

1. A printed circuit board comprising:
a first layer and a second layer substantially parallel to and spaced apart from the first layer;
an integrated circuit connected to the first layer and configured to provide a first electronic signal over a first conductive path between a first pair of conductive points and a second electronic signal over a second conductive path between a second pair of conductive points;
wherein the first conductive path includes a first narrow section extending between a first broad section and a second broad section, wherein:
the first narrow section has a first dimension; and
the first broad section and the second broad section have a second dimension, the second dimension greater than the first dimension; and
wherein the second conductive path includes a finger extending toward the narrow section of the first conductive path and having a third dimension, the third dimension greater than the second dimension.

2. The printed circuit board of claim 1, wherein:
the first pair of conductive points comprises a first conductive point and a second conductive point, and the second pair of conductive points comprises a third conductive point and a fourth conductive point;
the effective relative permittivity of the first conductive path is tuned such that the first electronic signal arrives at the second conductive point at a first time; and,
the effective relative permittivity of the second conductive path is tuned such that the second electronic signal arrives at the fourth conductive point at a second time.

3. The printed circuit board of claim 2, wherein the first time is substantially equal to the second time.

4. The printed circuit board of claim 2, wherein:
the effective relative permittivity of the first conductive path is further tuned such that the first electronic signal arrives at the second conductive point at a predetermined phase of the first signal; and
the effective relative permittivity of the second conductive path is further tuned such that the second electronic signal arrives at the fourth conductive point at a predetermined phase of the second signal.

5. The printed circuit board of claim 4, wherein the predetermined phase of the first signal is substantially equal to the predetermined phase of the second signal.

6. The printed circuit board of claim 4, wherein:
the first conductive path comprises a plurality of unit cells each having a narrow section and a unit length, and selection of the dimensions of the narrow section and of the unit length of the first conductive path tunes the effective relative permittivity of the first conductive path such that the first signal arrives at the second conductive point at the first time and at the predetermined phase of the first signal; and
the second conductive path comprises a plurality of unit cells each having a narrow section and a unit length, and selection of the dimensions of the narrow section and of the unit length of the second conductive path tunes the effective relative permittivity of the second conductive path such that the second signal arrives at the fourth conductive point at the second time and at the predetermined phase of the second signal.

7. The printed circuit board of claim 2, wherein:
the first conductive path comprises a plurality of unit cells each having a narrow section and a unit length, and selection of the dimensions of the narrow section and of the unit length of the first conductive path tunes the effective relative permittivity of the first conductive path such that the first signal arrives at the second conductive point at the first time and at the predetermined phase of the first signal; and
the second conductive path comprises a plurality of unit cells each having a narrow section and a unit length, and selection of the dimensions of the narrow section and of the unit length of the second conductive path tunes the effective relative permittivity of the second conductive path such that the second signal arrives at the fourth conductive point at the second time and at the predetermined phase of the second signal.

8. A mobile device comprising:
a printed circuit board having a first layer and a second layer substantially parallel to and spaced apart from the first layer;
an integrated circuit comprising a transceiver configured to receive radio frequency signals via a downlink from an access point, the transceiver connected to the first layer and configured to provide a first electronic signal over a first conductive path between a first pair of conductive points and a second electronic signal over a second conductive path between a second pair of conductive points;
wherein the first conductive path includes a first narrow section extending between a first broad section and a second broad section, wherein:
the first narrow section has a first dimension; and
the first broad section and the second broad section have a second dimension, the second dimension greater than the first dimension; and
wherein the second conductive path includes a finger extending toward the narrow section of the first conductive path and having a third dimension, the third dimension greater than the second dimension.

9. The mobile device of claim 8, wherein:
the first pair of conductive points comprises a first conductive point that is coupled to the transceiver and a second conductive point that is coupled to a first antenna element, and the second pair of conductive points comprises a third conductive point that is coupled to the transceiver and a fourth conductive point that is coupled to a second antenna element;
the effective relative permittivity of the first conductive path is tuned such that the first electronic signal arrives at the second conductive point at a first time; and
the effective relative permittivity of the second conductive path is tuned such that the second electronic signal arrives at the fourth conductive point at a second time.

10. The mobile device of claim 9, wherein the first time is substantially equal to the second time.

11. The mobile device of claim 10, wherein the first signal is at a first polarity and the second signal is at a second polarity.

12. The mobile device of claim 9, wherein:
the effective relative permittivity of the first conductive path is further tuned such that the first electronic signal arrives at the second conductive point at a predetermined phase of the first signal; and
the effective relative permittivity of the second conductive path is further tuned such that the second electronic signal arrives at the fourth conductive point at a predetermined phase of the second signal.

13. The mobile device of claim 12, wherein the predetermined phase of the first signal is substantially equal to the predetermined phase of the second signal.

14. The mobile device of claim 12, wherein:
the first conductive path comprises a plurality of unit cells each having a narrow section and a unit length, and selection of the dimensions of the narrow section and of the unit length of the first conductive path tunes the effective relative permittivity of the first conductive path such that the first signal arrives at the second conductive point at the first time and at the predetermined phase of the first signal; and
the second conductive path comprises a plurality of unit cells each having a narrow section and a unit length, and selection of the dimensions of the narrow section and of the unit length of the second conductive path tunes the effective relative permittivity of the second conductive path such that the second signal arrives at the fourth conductive point at the second time and at the predetermined phase of the second signal.

15. The mobile device of claim 9, wherein:
the first conductive path comprises a plurality of unit cells each having a narrow section and a unit length, and selection of the dimensions of the narrow section and of the unit length of the first conductive path tunes the effective relative permittivity of the first conductive path such that the first signal arrives at the second conductive point at the first time and at the predetermined phase of the first signal; and
the second conductive path comprises a plurality of unit cells each having a narrow section and a unit length, and selection of the dimensions of the narrow section and of the unit length of the second conductive path tunes the effective relative permittivity of the second conductive path such that the second signal arrives at the fourth conductive point at the second time and at the predetermined phase of the second signal.

16. A base station comprising:
a printed circuit board having a first layer and a second layer substantially parallel to and separated from the first layer;
an integrated circuit transceiver comprising a plurality of antenna feeds for an antenna array for downlink radio signal transmission, at least some of the plurality of antenna feeds being connected to the first layer and configured to provide a first electronic signal over a first conductive path between a first pair of conductive points and a second electronic signal over a second conductive path between a second pair of conductive points;

wherein the first conductive path includes a first narrow section extending between a first broad section and a second broad section, wherein:
the first narrow section has a first dimension; and
the first broad section and the second broad section have a second dimension, the second dimension greater than the first dimension; and wherein the second conductive path includes a finger extending toward the narrow section of the first conductive path and having a third dimension, the third dimension greater than the second dimension.

17. The base station of claim 16, wherein:
the first pair of conductive points comprises a first conductive point that is coupled to a first antenna feed of the plurality of antenna feeds and a second conductive point that is coupled to a first antenna element, and the second pair of conductive points comprises a third conductive point that is coupled to a second antenna feed of the plurality of antenna feeds and a fourth conductive point that is coupled to a second antenna element;
the effective relative permittivity of the first conductive path is tuned such that the first electronic signal arrives at the second conductive point at a first time; and
the effective relative permittivity of the second conductive path is tuned such that the second electronic signal arrives at the fourth conductive point at a second time.

18. The base station of claim 17, wherein the first time is substantially, equal to the second time.

19. The base station of claim 17, wherein:
the effective relative permittivity of the first conductive path is further tuned such that the first electronic signal arrives at the second conductive point at a predetermined phase of the first signal; and
the effective relative permittivity of the second conductive path is further tuned such that the second electronic signal arrives at the fourth conductive point at a predetermined phase of the second signal.

20. The base station of claim 19, wherein the predetermined phase of the first signal is substantially equal to the predetermined phase of the second signal.

21. The base station of claim 19, wherein:
the first conductive path comprises a plurality of unit cells each having a narrow section and a unit length, and selection of the dimensions of the narrow section and of the unit length of the first conductive path tunes the effective relative permittivity of the first conductive path such that the first signal arrives at the second conductive point at the first time and at the predetermined phase of the first signal; and
the second conductive path comprises a plurality of unit cells each having a narrow section and a unit length, and selection of the dimensions of the narrow section and of the unit length of the second conductive path tunes the effective relative permittivity of the second conductive path such that the second signal arrives at the fourth conductive point at the second time and at the predetermined phase of the second signal.

22. The base station of claim 17, wherein:
the first conductive path comprises a plurality of unit cells each having a narrow section and a unit length, and selection of the dimensions of the narrow section and of the unit length of the first conductive path tunes the effective relative permittivity of the first conductive path such that the first signal arrives at the second conductive point at the first time and at the predetermined phase of the first signal; and
the second conductive path comprises a plurality of unit cells each having a narrow section and a unit length, and selection of the dimensions of the narrow section and of the unit length of the second conductive path tunes the effective relative permittivity of the second conductive path such that the second signal arrives at the fourth conductive point at the second time and at the predetermined phase of the second signal.

23. The base station of claim 17, wherein the first signal is at a first polarity and the second signal is at a second polarity.

24. An electronic system comprising:
a printed circuit board (PCB) having a first layer and a second layer substantially parallel to the first layer;
an integrated circuit (IC) connected to the first layer and configured to provide a first electronic signal over a first conductive path between a first pair of conductive points and a second electronic signal over a second conductive path between a second pair of conductive points;

wherein the first conductive path includes a first narrow section extending between a first broad section and a second broad section, wherein:
the first narrow section has a first dimension; and
the first broad section and the second broad section have a second dimension, the second dimension greater than the first dimension; and wherein the second conductive path includes a finger extending toward the narrow section of the first conductive path and having a third dimension, the third dimension greater than the second dimension.

25. The electronic system of claim 24, wherein:
the first pair of conductive points comprises a first conductive point and a second conductive point, and the second conductive pair of conductive points comprises a third conductive point and a fourth conductive point;
the effective relative permittivity of the first conductive path is tuned such that the first electronic signal arrives at the second conductive point at a first time; and
the effective relative permittivity of the second conductive path is tuned such that the second electronic signal arrives at the fourth conductive point at a second time.

26. The electronic system of claim 25, wherein the first time is substantially equal to the second time.

27. The electronic system of claim 25, wherein:
the effective relative permittivity of the first conductive path is further tuned such that the first electronic signal arrives at the second conductive point at a predetermined phase of the first signal; and
the effective relative permittivity of the second conductive path is further tuned such that the second electronic signal arrives at the fourth conductive point at a predetermined phase of the second signal.

28. The electronic system of claim 27, wherein the predetermined phase of the first signal is substantially equal to the predetermined phase of the second signal.

29. The electronic system of claim 27, wherein:
the first conductive path comprises a plurality of unit cells each having a narrow section and a unit length, and selection of the dimensions of the narrow section and of the unit length of the first conductive path tunes the effective relative permittivity of the first conductive path such that the first signal arrives at the second conductive point at the first time and at the predetermined phase of the first signal; and the second conductive path comprises a plurality of unit cells each having a narrow section and a unit length, and selection of the dimensions of the narrow section and of the unit length of the second conductive path tunes the effective relative permittivity of the second conductive path such that the second signal arrives at the fourth conductive point at the second time and at the predetermined phase of the second signal.

30. The electronic system of claim 25, wherein:

the first conductive path comprises a plurality of unit cells each having a narrow section and a unit length, and selection of the dimensions of the narrow section and of the unit length of the first conductive path tunes the effective relative permittivity of the first conductive path such that the first signal arrives at the second conductive point at the first time and at the predetermined phase of the first signal; and the second conductive path comprises a plurality of unit cells each having a narrow section and a unit length, and selection of the dimensions of the narrow section and of the unit length of the second conductive path tunes the effective relative permittivity of the second conductive path such that the second signal arrives at the fourth conducive point at the second time and at the predetermined phase of the second signal.

* * * * *